(12) United States Patent
Ramorini et al.

(10) Patent No.: US 12,401,281 B2
(45) Date of Patent: Aug. 26, 2025

(54) MULTIPHASE DC-DC SWITCHING CONVERTER CIRCUIT, CORRESPONDING POWER MANAGEMENT INTEGRATED CIRCUIT AND DISPLAY DEVICE

(71) Applicant: STMicroelectronics S.r.l., Agrate Brianza (IT)

(72) Inventors: Stefano Ramorini, Milan (IT); Giuseppe Calderoni, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 242 days.

(21) Appl. No.: 18/141,784

(22) Filed: May 1, 2023

(65) Prior Publication Data

US 2023/0353053 A1    Nov. 2, 2023

(30) Foreign Application Priority Data

May 2, 2022    (IT) .......................... 102022000008768

(51) Int. Cl.
*H02M 1/00* (2007.01)
*H02M 3/158* (2006.01)

(52) U.S. Cl.
CPC ....... *H02M 3/1584* (2013.01); *H02M 1/0009* (2021.05); *H02M 1/0025* (2021.05); *H02M 1/007* (2021.05)

(58) Field of Classification Search
CPC .. H02M 3/1584; H02M 1/007; H02M 1/0009; H02M 1/0025
See application file for complete search history.

(56) References Cited

U.S. PATENT DOCUMENTS

| | | |
|---|---|---|
| 8,710,810 B1 | 4/2014 | McJimsey et al. |
| 2008/0007977 A1 | 1/2008 | Piper et al. |
| 2011/0291485 A1 | 12/2011 | Canclini et al. |
| 2015/0228355 A1 | 8/2015 | Bogner |
| 2017/0038875 A1 | 2/2017 | Lee |
| 2019/0052173 A1 | 2/2019 | Shumkov et al. |
| 2019/0081601 A1 | 3/2019 | Hurwitz et al. |
| 2019/0363540 A1 | 11/2019 | Pan et al. |
| 2025/0079991 A1* | 3/2025 | Calderoni ............ H02M 1/007 |

FOREIGN PATENT DOCUMENTS

| | | |
|---|---|---|
| EP | 1753108 A2 | 2/2007 |
| JP | 2006129025 A | 5/2006 |

OTHER PUBLICATIONS

IT Search Report and Written Opinion for priority application, IT Appl. No. 102022000008768, report dated Nov. 28, 2022, 12 pgs.

* cited by examiner

*Primary Examiner* — Adolf D Berhane
(74) *Attorney, Agent, or Firm* — Crowe & Dunlevy LLC

(57) ABSTRACT

A multiphase DC-DC converter has two converter arrangements, each with a switching stage that has a switching node, an inductor, a converter output node, a high-side switch, and a low-side switch. Current sensing circuits detect the instantaneous current flowing through either the high-side or low-side switches, and signal time-averaging circuits produce time-averaged signals indicating the average current during a switch conduction interval. The time-averaged signals are added up and re-scaled based on the time period of the switching nodes' electrical coupling to the converter output nodes to generate an output signal for the average output current.

24 Claims, 15 Drawing Sheets

MULTIPHASE DC-DC SWITCHING CONVERTER CIRCUIT, CORRESPONDING POWER MANAGEMENT INTEGRATED CIRCUIT AND DISPLAY DEVICE

PRIORITY CLAIM

This application claims the priority benefit of Italian Application for Patent No. 102022000008768, filed on May 2, 2022, the content of which is hereby incorporated by reference in its entirety to the maximum extent allowable by law.

TECHNICAL FIELD

The description relates to circuits and methods for sensing (e.g., measuring) the current that flows in an electrical load supplied by a multiphase power converter. For instance, one or more embodiments herein may be applied to power converter integrated circuits for display devices, particularly display devices based on active-matrix organic light-emitting diode (AMOLED) technology.

BACKGROUND

Sensing the load current and the inductor current is a desirable feature in many power converter applications. For instance, knowing the value of the load current facilitates stable and efficient operation of power converters. Furthermore, the information about the magnitude of the load current may be used to properly size the converter switch (es), according to the operating conditions, and consequently improve the converter efficiency curve at light load conditions.

Low silicon area, low power consumption, high accuracy and/or precision, flexibility of use (e.g., the possibility of being tuned) and/or the capability of sensing low load currents are also desirable features of power converters.

Therefore, there is a need in the art to provide improved power converters with load current sensing capabilities that aim at providing one or more of such desirable features.

SUMMARY

An object of one or more embodiments is to contribute to the providing of such improved power converters.

According to one or more embodiments, such an object can be achieved by a multiphase DC-DC switching converter circuit having the features set forth herein.

One or more embodiments may relate to a corresponding power management integrated circuit.

One or more embodiments may relate to a corresponding display device.

In one or more embodiments, a multiphase DC-DC switching converter circuit (e.g., a buck-boost converter) includes a first DC-DC converter arrangement and a second DC-DC converter arrangement. The first DC-DC converter arrangement includes a first switching stage having a first switching node and a first converter output node, the first switching stage including a first high-side switch and a first low-side switch. The first DC-DC converter arrangement includes a first current sensing circuit configured to produce a first detection voltage signal indicative of (e.g., proportional to) the instantaneous current flowing through one of the first high-side switch and the first low-side switch. The first DC-DC converter arrangement includes a first time-averaging circuit configured to receive the first detection voltage signal and produce, as a function thereof (e.g., by time integration), a first time-averaged signal indicative of the average current flowing through the one of the first high-side switch and the first low-side switch during a respective switch conduction interval. The second DC-DC converter arrangement includes a second switching stage having a switching node and a second converter output node, the second switching stage including a second high-side switch and a second low-side switch. The second DC-DC converter arrangement includes a second current sensing circuit configured to produce a second detection voltage signal indicative of (e.g., proportional to) the instantaneous current flowing through one of the second high-side switch and the second low-side switch. The second DC-DC converter arrangement includes a second time-averaging circuit configured to receive the second detection voltage signal and produce, as a function thereof (e.g., by time integration), a second time-averaged signal indicative of the average current flowing through the one of the second high-side switch and the second low-side switch during a respective switch conduction interval. The multiphase DC-DC switching converter circuit further includes signal summation and re-scaling circuitry configured to receive the first time-averaged signal and the second time-averaged signal, add up the first and second time-averaged signals, and re-scale the first and second time-averaged signals by one or more factors indicative of the time period during which the first switching node is electrically coupled to the first converter output node and the time period during which the second switching node is electrically coupled to the second converter output node to produce an output signal indicative of the average output current of the multiphase DC-DC switching converter circuit.

One or more embodiments thus facilitate sensing the current flowing in the load supplied by a DC-DC converter circuit while providing low silicon area occupation, low quiescent current and/or high efficiency at light load of the converter circuit, as well as improved accuracy and/or suitability to sense low output current values.

In one or more embodiments, a power management integrated circuit comprises a first (e.g., boost) DC-DC converter circuit configured to produce a positive supply voltage for a display panel, and a second (e.g., buck-boost) DC-DC converter circuit according to one or more embodiments and configured to produce a negative supply voltage for the display panel.

In one or more embodiments, a display device comprises a display panel including light-emitting diodes arranged in a matrix, and a power management integrated circuit according to one or more embodiments. A positive supply terminal of the display panel is coupled to the first DC-DC converter circuit to receive the positive supply voltage and a negative supply terminal of the display panel is coupled to the second DC-DC converter circuit to receive the negative supply voltage.

BRIEF DESCRIPTION OF THE DRAWINGS

One or more embodiments will now be described, by way of example, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
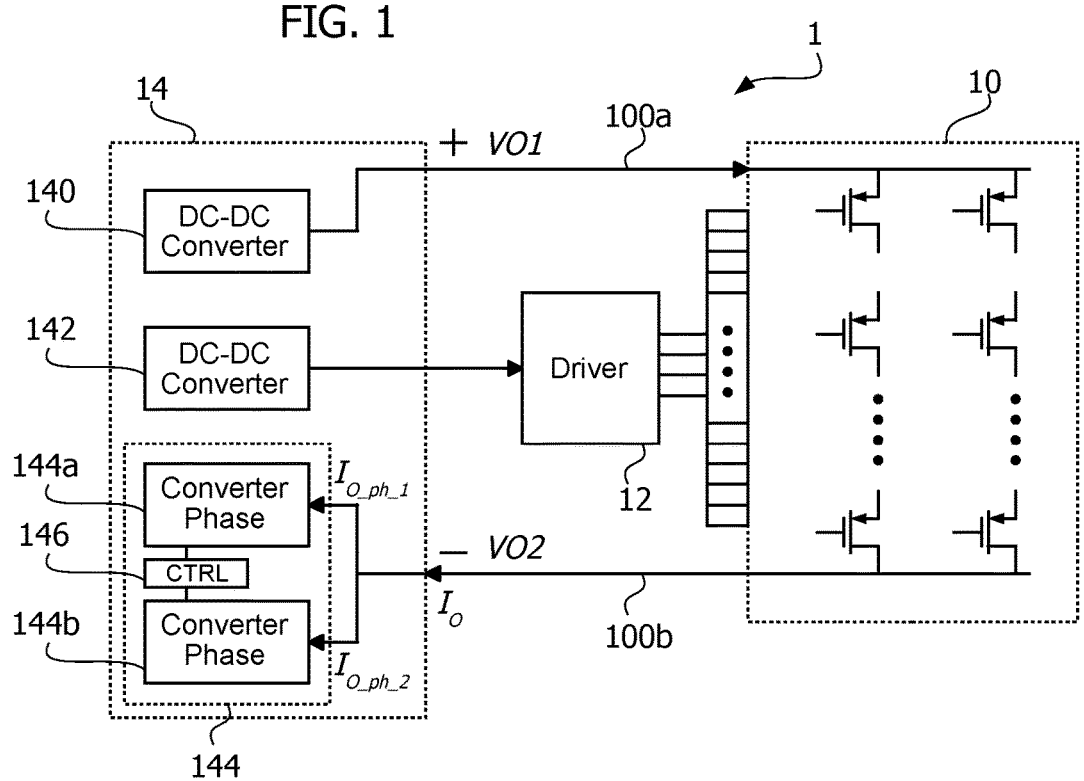
FIG. 1 is a circuit block diagram exemplary of an AMOLED display device according to one or more embodiments of the present description.

By way of introduction to the detailed description of exemplary embodiments, reference may first be made to FIG. 1, which is a circuit block diagram exemplary of a display device 1, e.g., an AMOLED display device. The display device 1 comprises an AMOLED panel or matrix 10, a driver circuit 12 (e.g., a row driver and column driver for driving the rows and columns of the AMOLED matrix 10), and a power management integrated circuit (PMIC) 14 configured to supply power to the AMOLED panel 10 and/or to the driver circuit 12. In particular, the power supply circuit 14 may comprise a first DC-DC converter 140, a second DC-DC converter 142 and a third multiphase DC-DC converter 144.

The first converter 140 and the third converter 144 may be configured to generate a differential supply voltage for the AMOLED panel 10. For instance, the first DC-DC converter 140 includes a boost converter coupled to a positive supply rail 100a that provides a positive supply voltage VO1 to the panel 10. The converter 140 typically operates in continuous conduction mode (CCM), even when the load current is null, in order to provide a flat output voltage VO1. Otherwise, flickering may occur in the AMOLED panel 10. The third DC-DC converter 144 includes a multiphase inverting buck-boost converter coupled to a negative supply rail 100b that provides a negative supply voltage VO2 to the panel 10. For instance, the converter 144 may comprise a first buck-boost converter arrangement 144a (first phase), a second buck-boost converter arrangement 144b (second phase) and a synchronization circuit or control circuit 146 that controls operation of the two phases 144a and 144b. The converter 144 can typically change its operation mode according to the load current (e.g., the current sunk by the AMOLED panel 10), without causing any issue to the panel 10 such as flickering.

The second converter 142 may be configured to generate a supply voltage for the driver circuit 12.

Conventional power supply circuits 14 for AMOLED display panels may rely on dedicated sensing circuitry for sensing the load current in the boost converter 140. This approach, however, results in additional quiescent current and increased silicon area of the power supply chip 14. As a consequence of the extra current consumption, the efficiency is lowered, especially at light load. Additionally, the current sensing arrangements provided in conventional power supply circuits can typically measure the current in one direction only, resulting in a measurement error when the converter 140 works in forced continuous conduction mode (FCCM), since in this condition the current that has to be measured can have both positive and negative values.

Figure 2:
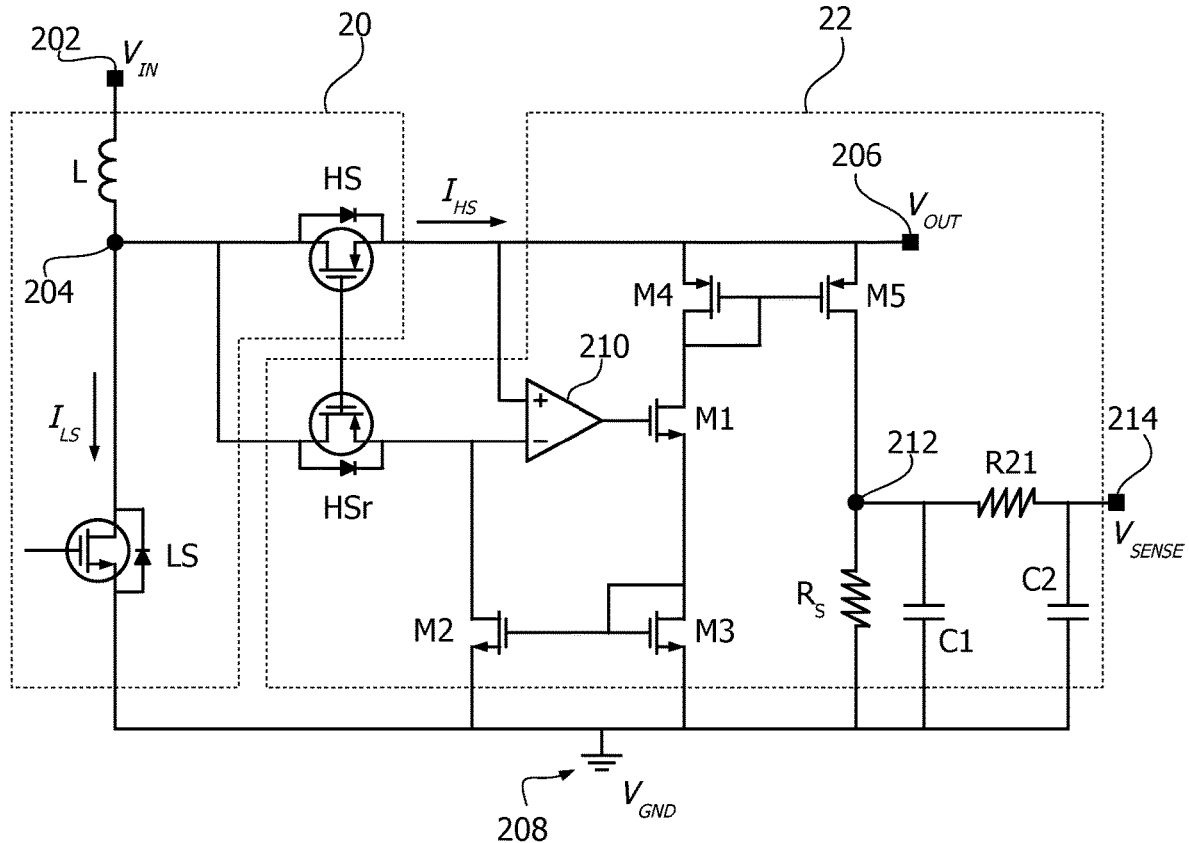
FIG. 2 is a circuit block diagram exemplary of a single-phase DC-DC boost converter and related high-side current sensing circuitry.

In this context, FIG. 2 is a circuit diagram exemplary of a DC-DC boost converter 20 (as may be used in converter 140) and a related high-side current sensing circuit 22 configured to sense the current flowing through the high-side switch of converter 20.

Converter 20 comprises an input node 202 configured to receive an input DC voltage VIN. An inductor L (e.g., an external inductor) is arranged between the input node 202 and a switching node 204 of the converter 20. A high-side switch HS (e.g., a p-channel power MOS transistor) is arranged between the switching node 204 and the output node 206 of the converter 20. A low-side switch LS (e.g., an n-channel power MOS transistor) is arranged between the switching node 204 and a reference or ground node 208 of the converter 20 that provides a reference or ground voltage $V_{GND}$ (e.g., 0 V). A current $I_{HS}$ flows through the high-side switch HS and a current $I_{LS}$ flows through the low-side switch LS. A capacitor (e.g., an external capacitor, not visible in the Figures annexed herein) may be coupled between the output node 206 and the reference node 208 to operate the converter 20. The high-side switch HS and the low-side switch LS are controlled by a control unit of the converter 20 (not visible in the Figures annexed herein) according to known control schemes, so that a regulated output DC voltage $V_{OUT}$ is produced at the output node 206.

The current sensing circuit 22 relies on a replica-based architecture with a closed loop in order to sense the waveform of the time-variant current $I_{HS}$ flowing through the high-side switch HS. In particular, the current sensing circuit 22 comprises a replica HSr of the high-side switch HS, coupled between node 204 (e.g., at a drain terminal of the replica power MOS transistor HSr) and the inverting input of an operational amplifier 210 such as an error amplifier (e.g., at a source terminal of the replica transistor HSr). The replica switch HSr may be smaller than the high-side switch HS: for instance, the channel width of high-side switch HS and the channel width of replica switch HSr may be in a N:1 ratio, with N>1. The replica switch HSr is controlled by the same control signal received by the high-side switch HS: the gate terminals of transistors HS and HSr may be coupled one to the other. The non-inverting input of the operational amplifier 210 is coupled downstream of the high-side switch HS (e.g., to the source terminal of transistor HS). The output signal of the operational amplifier 210 controls the conductivity of a first transistor M1, e.g., it is coupled to the gate terminal of an n-channel MOS transistor M1. A first current mirror circuit is arranged between the replica switch HSr, the source terminal of transistor M1 and the ground node 208. In particular, the first current mirror circuit comprises an n-channel MOS transistor M2 having a drain terminal coupled to the inverting input of the operational amplifier 202 and a source terminal coupled to the ground node 208, and an n-channel MOS transistor M3 having a drain terminal coupled to the source terminal of transistor M1 and a source terminal coupled to the ground node 208. The gate terminals of transistors M2 and M3 are connected one to the other and connected to the drain terminal of transistor M3, so that the current flowing through transistors M1 and M3 is mirrored to flow through transistor M2. Transistors M2 and M3 may provide a mirroring factor of 1:1 (e.g., they may have the same channel width and length). A second current mirror circuit is arranged between the drain terminal of transistor M1, a sensing node 212 of the current sensing circuit 22, and the output node 206 of the converter 10. In particular, the second current mirror circuit comprises a p-channel MOS transistor M4 having a drain terminal coupled to the drain terminal of transistor M1 and a source terminal coupled to the output node 206, and a p-channel MOS transistor M5 having a drain terminal coupled to the sensing node 212 and a source terminal coupled to the output node 206. The gate terminals of transistors M4 and M5 are connected one to the other and connected to the drain terminal of transistor M4, so that the current flowing through transistors M1 and M4 is mirrored to flow through transistor M5. Transistors M4 and M5 may provide a mirroring factor of 1:1 (e.g., they may have the same channel width and length). A resistor $R_S$ is coupled between the sensing node 212 and the ground node 208. Another resistor R21 is coupled between the sensing node 212 and an output node 214 of the current sensing circuit 22. A first capacitor C1 is coupled between the sensing node 212 and the ground node 208, and a second capacitor C2 is coupled between the output node 214 and the ground node 208, so that the current flowing through transistor M5 produces a voltage $V_{SENSE}$ at the output node 214 that is indicative of (e.g., proportional to) the current $I_{HS}$ flowing through the high-side switch HS.

Figure 3:
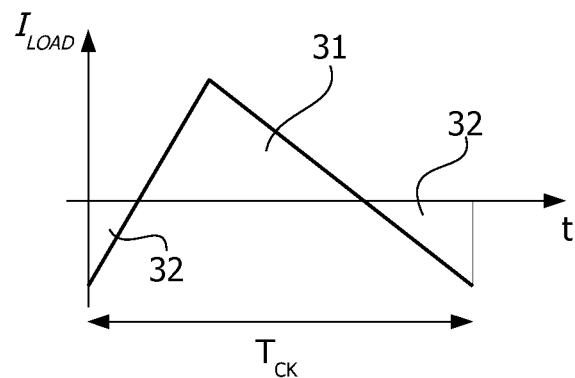
FIG. 3 is a time diagram exemplary of possible time evolution of the load current in a DC-DC boost converter as exemplified in FIG. 2.

As previously discussed, a current sensing circuit 22 as exemplified in FIG. 2 can sense a positive current flowing from the switching node 204 to the output node 206. Reverse (negative) current flowing from node 206 to node 204 cannot be sensed, resulting in a loss of accuracy for DC-DC converters working in forced continuous conduction mode, where current inversion at light load takes place. To this regard, FIG. 3 is a time diagram that exemplifies a portion of the load current $I_{LOAD}$ in light-load CCM that is not sensed by circuit 22 over a clock period $T_{CK}$: the positive area 31 is correctly sensed while the negative areas 32 may not be sensed.

In order to improve the currently available converters, possibly reusing most of the circuitry already present in the chips, and reducing silicon area and power consumption, one or more embodiments may rely on a different architecture where the load current is sensed in the inverting buck-boost converter 144 of the power management circuit 14, instead of being measured in the boost converter 140. Additionally, since the voltage generator 144 for the negative rail 100b works exclusively in positive current direction, the measurement accuracy at light load may be improved since no negative currents have to be sensed. In one or more embodiments, the sensing operation in the buck-boost converter 144 may be carried out by resorting (at least partially) to a circuit already present in some commercial devices (e.g., conventionally used for control and/or for protection purposes), thereby providing improved power efficiency and/or reduced silicon area.

Figure 4:
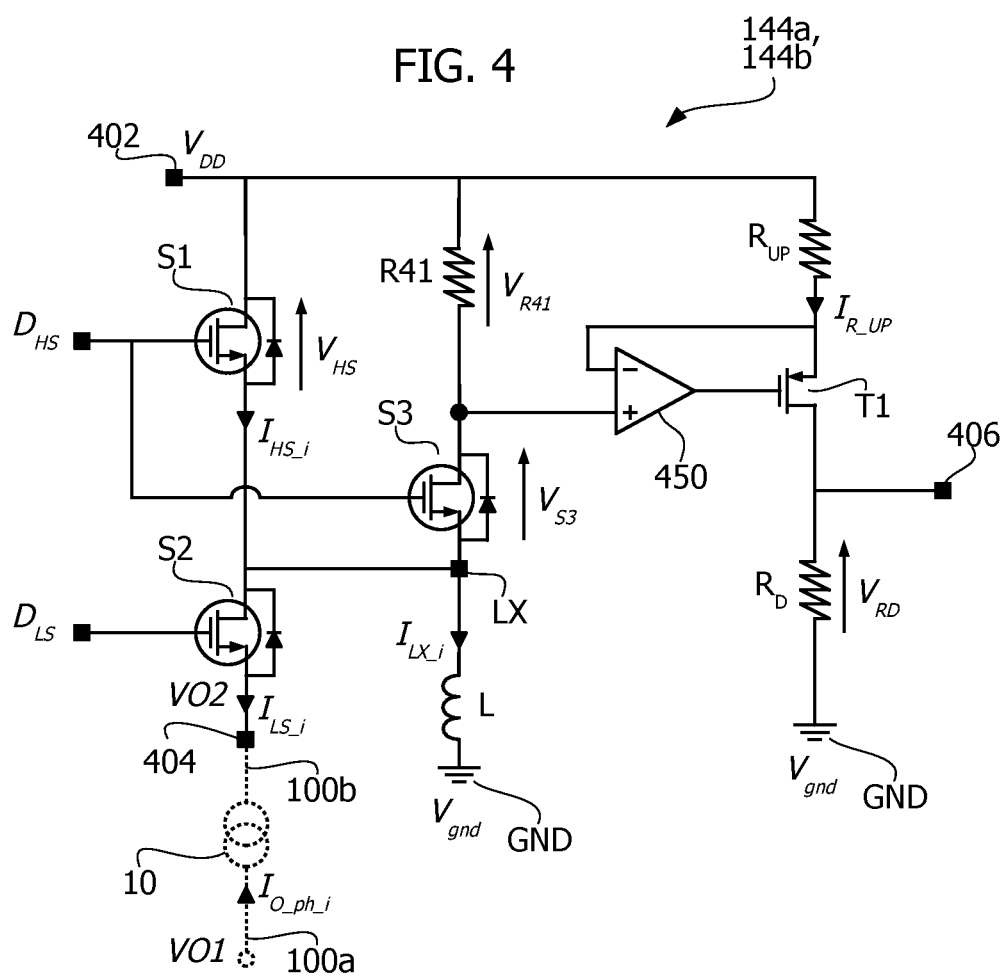
FIG. 4 is a circuit block diagram exemplary of a single-phase DC-DC inverting buck-boost converter and related high-side current sensing circuitry.

FIG. 4 is a circuit block diagram exemplary of a possible implementation of a single-phase inverting buck-boost converter, such as converter 144a or 144b of FIG. 1, and related high-side current sensing circuitry which may be included in each phase of a multiphase converter 144. Current sensing circuitry as exemplified in FIG. 4 may be conventionally used for protection and/or loop control purposes.

As exemplified in FIG. 4, an inverting buck-boost converter may comprise an input node 402 configured to receive a DC input voltage $V_{DD}$ (e.g., provided by a battery), and an output node 404 configured to be coupled to the negative rail 100b of device 1 to supply a regulated voltage VO2 to the display panel 10. The converter further comprises a high-side switch S1 (e.g., an n-channel power MOS transistor) coupled between the input node 402 and a switching node LX, and a low-side switch S2 (e.g., an n-channel power MOS transistor) coupled between the switching node LX and the output node 404. In other words, switches S1 and S2 provide a half-bridge arrangement between nodes 402 and 404. An inductor L (e.g., an external inductor) is coupled (e.g., directly) between the switching node LX and ground GND at voltage $V_{gnd}$ (e.g., 0 V). The instantaneous current flowing through the high-side switch S1 is indicated herein as $I_{HS\_i}$; the instantaneous current flowing through the low-side switch S2 is indicated herein as $I_{LS\_i}$; the instantaneous current flowing through the inductor L is indicated herein as $I_{LX\_i}$; and the instantaneous current flowing through the load 10 is indicated herein as $I_{O\_ph\_i}$. Subscript "i" is used here to indicate the $i^{th}$ phase of a multiphase converter device such as converter 144 of FIG. 1.

As exemplified in FIG. 4, the high-side switch S1 and the low-side switch S2 have respective control terminals (e.g., gate terminals) configured to receive (e.g., from a control circuit such as circuit 146) respective drive signals $D_{HS}$ and $D_{LS}$ (e.g., PWM signals). Based on the control signals $D_{HS}$ and $D_{LS}$, the switches S1 and S2 switch from a first (e.g., open) state to a second (e.g., closed) state, and vice versa. In particular, signals $D_{HS}$ and $D_{LS}$ may cyclically vary in time so that the high-side switch S1 is closed for a time $T_{HS}$ during which the low-side switch S2 is open, and the low-side switch S2 is closed for a time $T_{LS}$ during which the high-side switch S1 is open. This controlled switching facilitates regulating a voltage level at the switching node LX and thus the current $I_{LX\_i}$ flowing through the inductor L.

As exemplified in FIG. 4, the converter 144a, 144b may comprise a high-side current sensing arrangement including a further switch S3 (e.g., an n-channel power MOS transistor) and a resistor R41. Resistor R41 is coupled between the input node 402 and a first terminal (e.g., drain terminal) of switch S3. The second terminal (e.g., source terminal) of switch S3 is coupled to the switching node LX. The switch S3 is configured to receive the same control signal $D_{HS}$ as the high-side switch S1. When the high-side switch S1 is closed (e.g., turned on), the switch S3 is also closed (e.g., turned on). As a result, a voltage drop $V_{R41}$ across resistor R41 can be expressed as $V_{R41}=V_{HS}-V_{S3}$, where $V_{HS}$ is the voltage drop across the high-side switch S1 and $V_{S3}$ is the voltage drop across the further switch S3, as indicated in FIG. 4.

In one or more embodiments, it is desirable that the voltage drop $V_{R41}$ across resistor R41 be substantially equal to the voltage drop $V_{HS}$ across the high-side switch S1, that is, $V_{R41} \approx V_{HS}$. In order to provide such a condition, switches S1 and S3 as well as resistor R41 may be dimensioned so that the product of the current flowing through resistor R41 and the on-resistance of switch S3 ($R_{onS3}$)—i.e., voltage $V_{S3}$—is negligible with respect to the voltage drop $V_{HS}$ across the high-side switch S1. For instance, the resistance of resistor R41 may be much greater than the on-resistance of switch S1 ($R_{onHS}$) and the on-resistance of switch S3 ($R_{onS3}$). The on-resistance of switch S3 ($R_{onS3}$) may be much lower than the resistance of resistor R41 in order to reduce the voltage partitioning factor and result in $V_{S3} \ll V_{R41}$. Since the lowest impedance path between nodes 402 and LX is the one through switch S1 (order of magnitude lower than the impedance of the path through R41 and S3), the voltage difference between node 402 and node LX is substantially determined by switch S1. Since the series arrangement of switch S3 and resistor R41 is coupled in parallel to switch S1, the voltage at the intermediate node is determined by the resistive partitioning between S3 and R41:

$$V_{S3} = V_{HS} \cdot \frac{R_{onS3}}{R_{onS3} + R41}$$

$$V_{R41} = V_{HS} \cdot \frac{R41}{R_{onS3} + R41}$$

In order to produce $V_{S3} \ll V_{R41}$ and thus $V_{R41} \approx V_{HS}$, the on-resistance of switch S3 ($R_{onS3}$) may be much lower than the resistance of resistor R41: $R_{onS3} \ll R41$ (e.g., $R_{onS3}$ may be two orders of magnitude lower than R41, or even less).

As exemplified in FIG. 4, the current sensing arrangement of converter 144a, 144b may further include a resistor $R_{UP}$, a transistor T1 (e.g., a p-channel MOS transistor) and a resistor $R_D$ coupled in series between the input node 402 and ground node GND. In particular, the resistor $R_{UP}$ has a first terminal coupled to the input node 402 and a second terminal coupled to a source terminal of transistor T1. The drain terminal of transistor T1 is coupled to a first terminal of resistor $R_D$ at node 406. The second terminal of resistor $R_D$ is coupled to ground node GND. The current sensing arrangement further includes a buffer stage 450 (e.g., an operational amplifier) having a first (e.g., non-inverting) input terminal coupled to a node intermediate resistor R41 and switch S3, a second (e.g., inverting) input terminal coupled to a node intermediate resistor $R_{UP}$ and transistor T1, and an output terminal coupled to the control (e.g., gate) terminal of transistor T1. When the high-side transistor S1 is closed, the voltage drop $V_{R41} \approx V_{HS}$ across resistor R41 is forced, via the buffer 450, across resistor $R_{UP}$. As a result, a current $I_{R\_UP}=V_{HS}/R_{UP}$ flows through the series arrangement including $R_{UP}$, T1 and $R_D$, thereby producing a voltage drop $V_{RD}$ across resistor $R_D$ equal to:

$$V_{RD} = \frac{V_{HS}}{R_{UP}} \cdot R_D = I_{HS\_i}(t) \cdot R_{onHS} \frac{R_D}{R_{UP}} = I_{HS\_i}(i) \cdot R_{onHS} \cdot K$$

where $R_{onHS}$ is the resistance of the high-side transistor S1 in the conductive (ON) state, and $K=R_D/R_{UP}$ is the gain factor of the current sensing arrangement. Therefore, voltage $V_{RD}$ at node 406 is indicative of the instantaneous high-side current $I_{HS\_i}(t)$. Also, when the high-side transistor S1 is open (e.g., off), voltage $V_{RD}$ is null. In other words, the current sensing arrangement exemplified herein has the role of "referring to ground" a voltage signal indicative of the high-side voltage $V_{HS}$.

Figure 5:
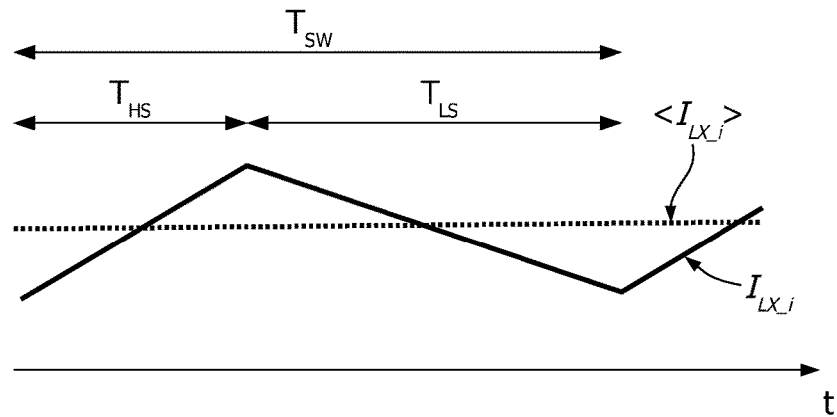
FIG. 5 is a time diagram exemplary of possible time evolution of the inductor instantaneous current and inductor average current in a single-phase DC-DC inverting buck-boost converter as exemplified in FIG. 4.

FIG. 5 is a time diagram exemplary of the instantaneous inductor current $I_{LX\_i}$ and the average inductor current $<I_{LX\_i}>$ during operation of a converter 144a, 144b as exemplified in FIG. 4. Substantially, the instantaneous inductor current $I_{LX\_i}$ can be considered to be the sum of two contributions, i.e., the high-side current $I_{HS\_i}$ that flows through the high-side switch S1 during the high-side period $T_{HS}$ (see also FIG. 6A) and the low-side current $I_{LS\_i}$ that flows through the low-side switch S2 during the low-side period $T_{LS}$ (see also FIG. 7A): $I_{LX\_i}=I_{HS\_i}+I_{LS\_i}$. A complete switching cycle has a duration $T_{SW}=T_{HS}+T_{LS}$ (assuming operation in continuous conduction mode, CCM).

The instantaneous inductor current $I_{LX\_i}$ may also be expressed as the sum of two contributions, i.e., the average inductor current $<I_{LX\_i}>$ and a ripple inductor current $I_{LX\_i\_ripple}$: $I_{LX\_i}=<I_{LX\_i}>+I_{LX\_i\_ripple}$. The ripple contribution $I_{LX\_i\_ripple}$ does not deliver power to the output of the converter 144a, 144b (e.g., to the load) insofar as its average value is null, so that the load current information of interest in various application is related to the value of the average inductor current $<I_{LX\_i}>$. Therefore, in the following, the inductor current $I_{LX\_i}$ may be approximated by its average value $<I_{LX\_i}>$.

Figure 6A:
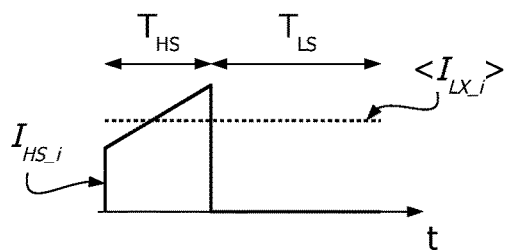
FIGS. 6A and 6B are time diagrams exemplary of possible time evolution of the inductor average current, high-side instantaneous current and high-side average current in a single-phase DC-DC inverting buck-boost converter as exemplified in FIG. 4.
Figure 6B:
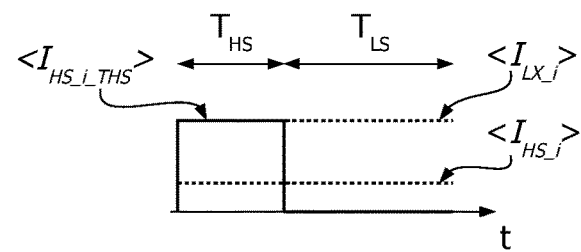
Figure 7A:
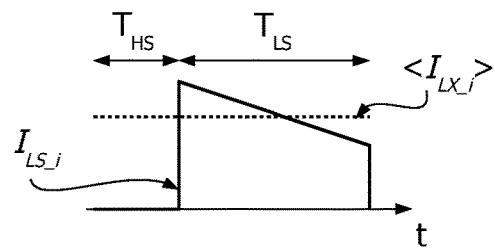
FIGS. 7A and 7B are time diagrams exemplary of possible time evolution of the inductor average current, low-side instantaneous current and low-side average current in a single-phase DC-DC inverting buck-boost converter as exemplified in FIG. 4.
Figure 7B:
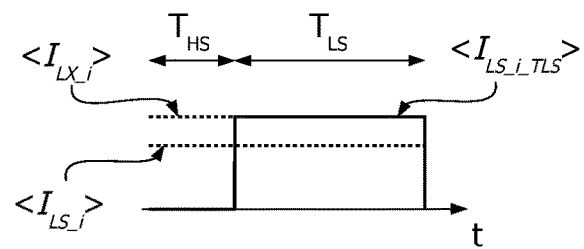

As exemplified in FIGS. 6A and 6B, the following conventions can be used when referring to the high-side current $I_{HS\_i}$. The value $<I_{HS\_i\_THS}>$ is the average value of current $I_{HS\_i}$ computed over the high-side period $T_{HS}$, which is equal to the average inductor current $<I_{LX\_i}>$. The value $<I_{HS\_i}>$ is the average value of current $I_{HS\_i}$ computed over a complete switching cycle $T_{SW}$, which is equal to $<I_{LX\_i}>\cdot D_{ph\_i}$ where $D_{ph\_i}$ is the duty-cycle of the high-side control signal $D_{HS}$. Similarly, as exemplified in FIGS. 7A and 7B, the following conventions can be used when referring to the low-side current $I_{LS\_i}$. The value $<I_{LS\_i\_TLS}>$ is the average value of current $I_{LS\_i}$ computed over the low-side period $T_{LS}$, which is equal to the average inductor current $<I_{LX\_i}>$. The value $<I_{LS\_i}>$ is the average value of current $I_{LS\_i}$ computed over a complete switching cycle $T_{SW}$, which is equal to $<I_{LX\_i}>\cdot(1-D_{ph\_i})$.

Figure 8A:
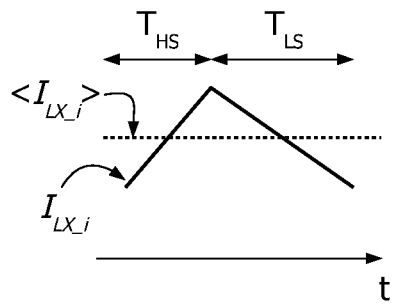
FIGS. 8A, 8B and 8C are time diagrams exemplary of possible time evolution of the inductor average current and inductor instantaneous current in a single-phase DC-DC inverting buck-boost converter as exemplified in FIG. 4, according to different operation modes of the converter.
Figure 8B:
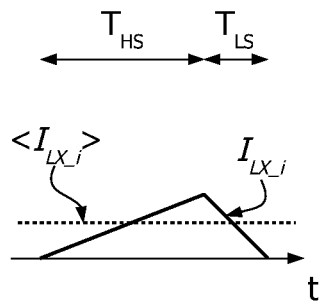
Figure 8C:
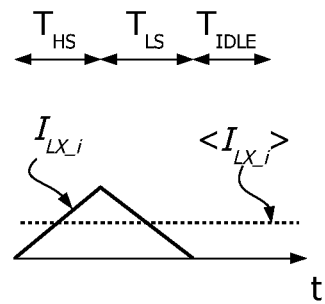

Additionally, as exemplified in FIGS. 8A, 8B and 8C, the average inductor current $<I_{LX\_i}>$ during the high-side phase $T_{HS}$ is the same as during the low-side phase $T_{LS}$, if the idle time $T_{IDLE}$ is neglected and just the coil magnetization and de-magnetization times are taken into consideration. FIG. 8A is a time diagram exemplary of the instantaneous inductor current $I_{LX\_i}$ and the average inductor current $<I_{LX\_i}>$ in case the converter operates in continuous conduction mode (CCM). FIG. 8B is a time diagram exemplary of the instantaneous inductor current $I_{LX\_i}$ and the average inductor current $<I_{LX\_i}>$ in case the converter operates in critical mode. FIG. 8C is a time diagram exemplary of the instantaneous inductor current $I_{LX\_i}$ and the average inductor current $<I_{LX\_i}>$ in case the converter operates in discontinuous conduction mode (DCM).

Figure 9:
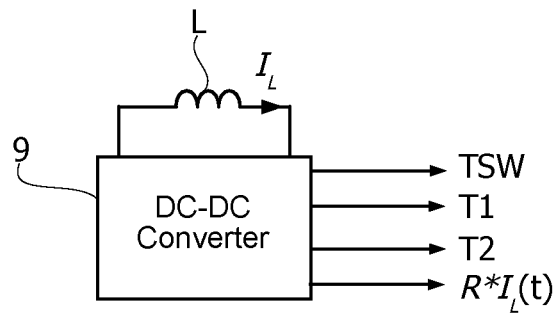
FIG. 9 is a circuit block diagram exemplary of a DC-DC switching converter.
Figure 10A:
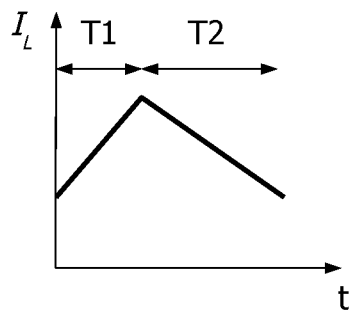
FIGS. 10A and 10B are time diagrams exemplary of possible time evolution of the inductor instantaneous current in a DC-DC switching converter operating in continuous conduction mode and in discontinuous conduction mode, respectively.
Figure 10B:
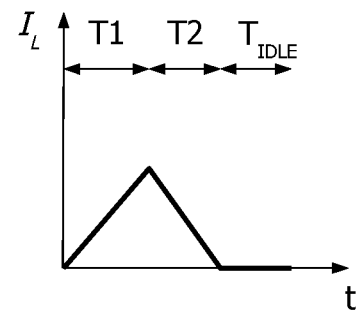

More generally, FIG. 9 is a circuit block diagram exemplary of a DC-DC converter 9 that can include one of a variety of different converter topologies (e.g., buck, boost, buck-boost, etc.). Converter 9 controls the current $I_L$ flowing through the (external) inductor L coupled thereto. Additionally, converter 9 may provide a first signal indicative of the switching period $T_{SW}$, a second signal indicative of the inductor magnetization period T1 (which can be a high-side period or a low-side period, depending on the converter topology), a third signal indicative of the inductor de-magnetization period T2 (which can be a low-side period or a high-side period, depending on the converter topology), and a fourth signal indicative of the instantaneous current $I_L(t)$ flowing in the inductor L, e.g., $R^*I_L(t)$, produced by a current sensing arrangement (which can be a high-side sensing arrangement as previously discussed, or a low-side sensing arrangement). In particular, depending on the current sensing arrangement adopted by converter 9, the signal $R^*I_L(t)$ may correspond to the voltage drop across the high-side switch or the low-side switch. FIGS. 10A and 10B are time diagrams exemplary of possible time evolution of the inductor current $I_L(t)$ when the converter 9 operates in continuous conduction mode (CCM) and in discontinuous conduction mode (DCM). The following equation applies: $TSW=T1+T2+T_{IDLE}$. In continuous conduction mode, the idle time $T_{IDLE}$ is null.

Figure 11:
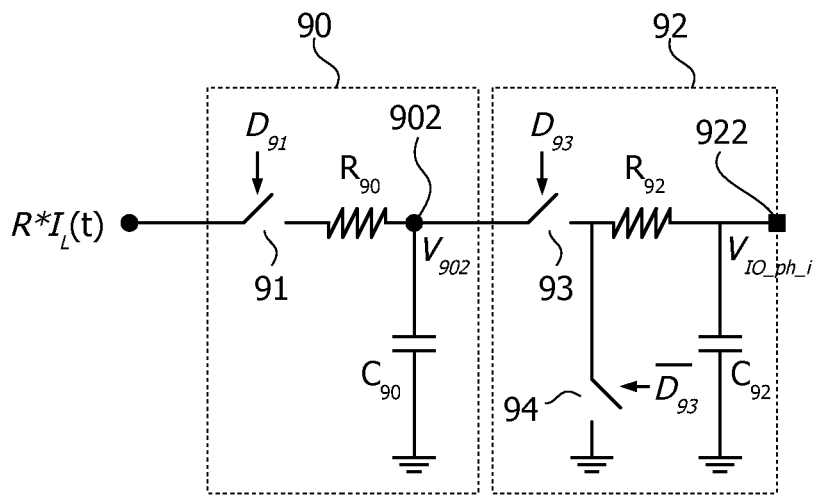
FIG. 11 is a circuit diagram exemplary of a load current sensing circuit for use in a DC-DC switching converter according to one or more embodiments of the present description.

One or more embodiments may rely on a circuit arrangement as exemplified in FIG. 11 to produce a voltage signal $V_{IO\_ph\_i}$ that is indicative of the average current provided by the converter to the load, as a function of signal $R^*I_L(t)$ indicative of the instantaneous inductor current. As exemplified in FIG. 11, one or more embodiments may comprise an average value accumulation circuit block 90 coupled to a sensing node of the converter to receive signal $R^*I_L(t)$ and configured to produce a signal at node 902 that is indicative of the average inductor current during the sensing period. The circuit block 90 includes a switch 91, a resistor $R_{90}$ and a capacitor $C_{90}$. Switch 91 has a first terminal configured to receive signal $R^*I_L(t)$ and a second terminal coupled to the first terminal of resistor $R_{90}$, and is configured to receive a control signal $D_{91}$ to be controlled thereby. The resistor $R_{90}$ has a second terminal coupled to node 902. The capacitor $C_{90}$ is coupled between node 902 and ground node GND and forms an RC filter circuit with resistor $R_{90}$. Therefore, the RC filter $R_{90}$, $C_{90}$ can charge and discharge (only) during the turn-on phase of switch 91 (low impedance state or closed state). During the high impedance state, the filter sees an open circuit and there is no closed loop where the current can flow. As a result, voltage $V_{902}$ at node 902 results from sampling and integrating voltage $R^*I_L(t)$ over the period during which switch 91 is closed, and is thus indicative of the average of signal $R^*I_L(t)$ calculated over the interval in which switch 91 is closed: $<I_{LX\_i}>$.

As exemplified in FIG. 11, one or more embodiments may comprise a time average circuit block 92 coupled to node 902 and configured to produce a signal at node 922 that is indicative of the average load current $<I_{O\_ph\_i}>$. The circuit block 92 includes a first switch 93, a second switch 94, a resistor $R_{92}$ and a capacitor $C_{92}$. Switch 93 has a first terminal coupled to node 902 and a second terminal coupled to the first terminal of resistor $R_{92}$, and is configured to receive a control signal $D_{93}$ to be controlled thereby. Switch 94 has a first terminal coupled to the second terminal of switch 93 and a second terminal coupled to ground node GND, and is configured to receive the complement of control signal $D_{93}$ to be controlled thereby. Resistor $R_{92}$ has a second terminal coupled to node 922. Capacitor $C_{92}$ is coupled between node 922 and ground node GND and forms an RC filter circuit with resistor $R_{92}$. As a result, voltage $V_{IO\_ph\_i}$ at node 922 is indicative of the voltage $V_{902}$ multiplied by a factor equal to the duty-cycle of signal $D_{93}$.

In one or more embodiments, a buffer circuit (not visible in the Figures annexed herein) may be arranged between the output of circuit 90 and the input of circuit 92.

A circuit arrangement as exemplified in FIG. 11 may be used for sensing the load current in a variety of converter topologies, by appropriately driving the switches 91, 93 and 94.

Figure 12:
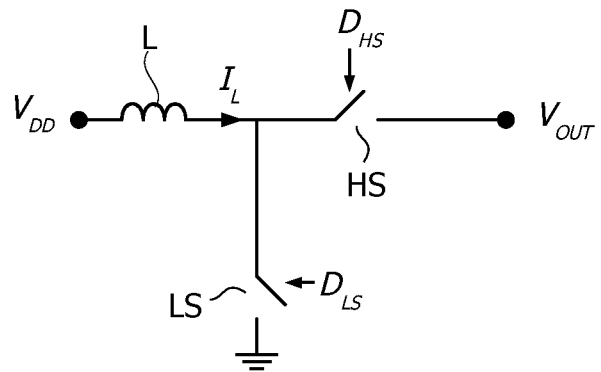
FIG. 12 is a circuit diagram exemplary of a boost DC-DC switching converter.

For instance, FIG. 12 is a circuit diagram exemplary of a two-switch boost DC-DC converter, where the high-side switch HS is controlled by signal $D_{HS}$ and the low-side switch LS is controlled by signal $D_{LS}$. In case signal $R^*I_L(t)$ is sensed during the low-side conduction period, switch 91 can be driven by signal $D_{LS}$ (i.e., $D_{91}=D_{LS}$), switch 93 can be driven by signal $D_{HS}$ (i.e., $D_{93}=D_{HS}$), and switch 94 can be driven by the complement of signal $D_{HS}$ (i.e., $D_{94}=\overline{D_{HS}}$) to produce an output voltage $V_{IO\_ph\_i}$ at node 922 that is indicative of the output current of the converter. In case signal $R^*I_L(t)$ is sensed during the high-side conduction period, switch 91 can be driven by signal $D_{HS}$ (i.e., $D_{91}=D_{HS}$), switch 93 can be driven by signal $D_{HS}$ (i.e., $D_{93}=D_{HS}$), and switch 94 can be driven by the complement of signal $D_{HS}$ (i.e., $D_{94}=\overline{D_{HS}}$) to produce an output voltage $V_{IO\_ph\_i}$ at node 922 that is indicative of the output current of the converter. Table I that appears at the end of this description is indicative of the duration of the time intervals during which switches 91, 93 and 94 are closed in the cases exemplified above, in terms of inductor magnetization times (T1) and demagnetization times (T2).

Figure 13:
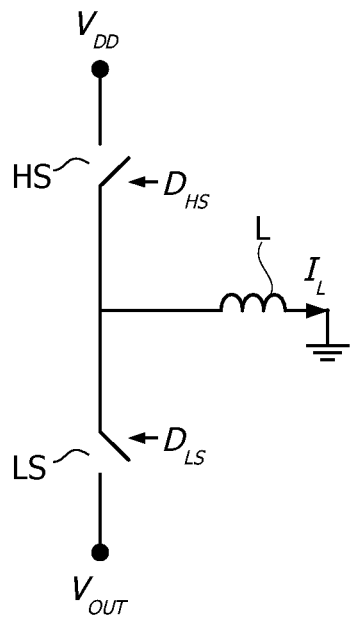
FIG. 13 is a circuit diagram exemplary of a buck-boost DC-DC switching converter.

According to another example, FIG. 13 is a circuit diagram exemplary of a two-switch buck-boost inverting DC-DC converter, where the high-side switch HS is controlled by signal $D_{HS}$ and the low-side switch LS is controlled by signal $D_{LS}$. In case signal $R^*I_L(t)$ is sensed during the high-side conduction period, switch 91 can be driven by signal $D_{HS}$ (i.e., $D_{91}=D_{HS}$), switch 93 can be driven by signal $D_{LS}$ (i.e., $D_{93}=D_{LS}$), and switch 94 can be driven by the complement of signal $D_{LS}$ (i.e., $D_{94}=\overline{D_{LS}}$) to produce an output voltage $V_{IO\_ph\_i}$ at node 922 that is indicative of the output current of the converter. In case signal $R^*I_L(t)$ is sensed during the low-side conduction period, switch 91 can be driven by signal $D_{LS}$ (i.e., $D_{91}=D_{LS}$), switch 93 can be driven by signal $D_{LS}$ (i.e., $D_{93}=D_{LS}$), and switch 94 can be driven by the complement of signal $D_{LS}$ (i.e., $D_{94}=\overline{D_{LS}}$) to produce an output voltage $V_{IO\_ph\_i}$ at node 922 that is indicative of the output current of the converter. Table II that appears at the end of the description is indicative of the duration of the time intervals during which switches 91, 93 and 94 are closed in the cases exemplified above, in terms of inductor magnetization/demagnetization times.

Figure 14:
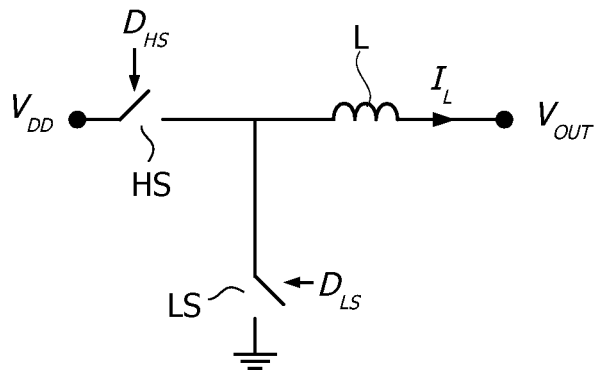
FIG. 14 is a circuit diagram exemplary of a buck DC-DC switching converter.

According to a further example, FIG. 14 is a circuit diagram exemplary of a two-switch buck DC-DC converter, where the high-side switch HS is controlled by signal $D_{HS}$ and the low-side switch LS is controlled by signal $D_{LS}$. In case signal $R^*I_L(t)$ is sensed during the high-side conduction period, switch 91 can be driven by signal $D_{HS}$ (i.e., $D_{91}=D_{HS}$), switch 93 can be closed during the entire switching period, and switch 94 can be open during the entire switching period to produce an output voltage $V_{IO\_ph\_i}$ at node 922 that is indicative of the output current of the converter. In case signal $R^*I_L(t)$ is sensed during the low-side conduction period, switch 91 can be driven by signal $D_{LS}$ (i.e., $D_{91}=D_{LS}$), switch 93 can be closed during the entire switching period, and switch 94 can be open during the entire switching period to produce an output voltage $V_{IO\_ph\_i}$ at node 922 that is indicative of the output current of the converter. Table III that appears at the end of the description is indicative of the duration of the time intervals during which switches 91, 93 and 94 are closed in the cases exemplified above, in terms of inductor magnetization/demagnetization times. Therefore, in a buck converter as exemplified in FIG. 14 the average inductor current corresponds to the average output current; circuit block 92 can be considered to be always active, and thus could even be omitted.

Figure 15:
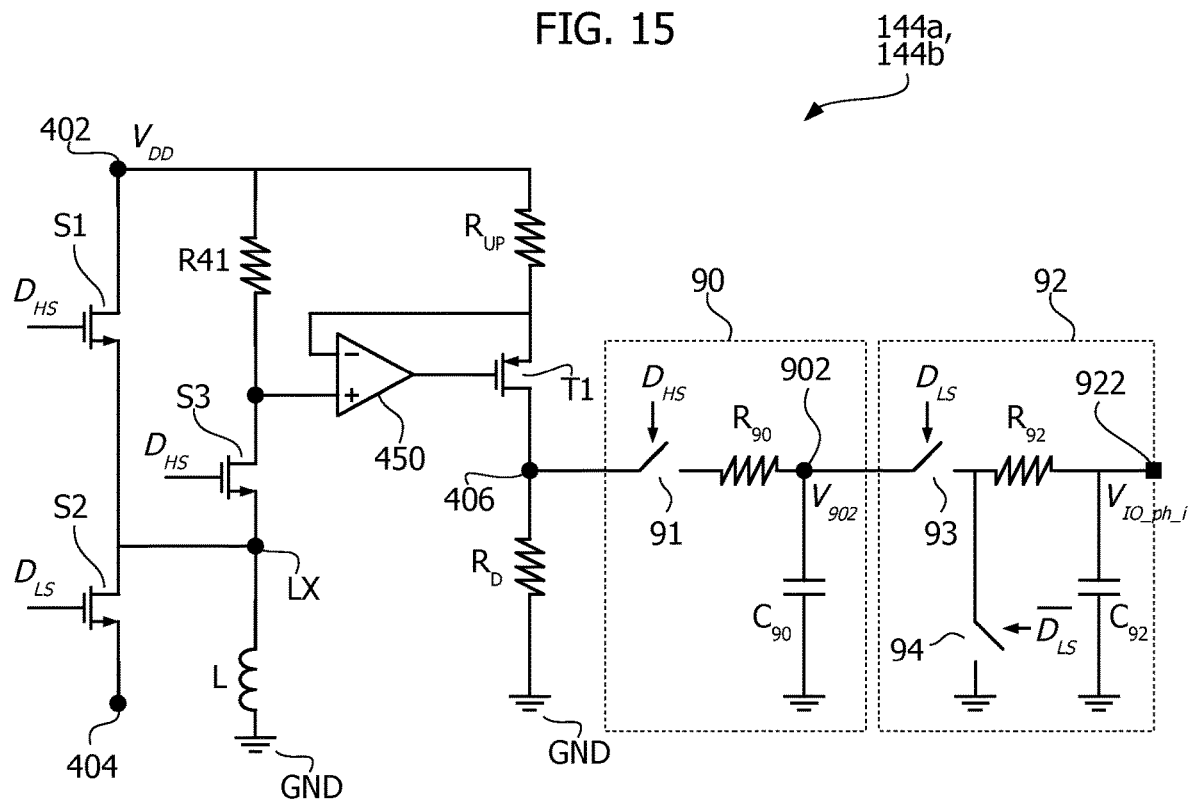
FIG. 15 is a circuit block diagram exemplary of a single-phase DC-DC inverting buck-boost converter and related high-side current sensing circuitry.

As a further detailed example, FIG. 15 is a circuit diagram exemplary of the single-phase inverting buck-boost converter 144a or 144b of FIG. 4, including the sensing circuitry configured to measure the average inductor current $\langle I_{LX\_i}\rangle$ and output current. In the example of FIG. 15, the average inductor current $\langle I_{LX\_i}\rangle$ is computed as a function of the average high-side current $\langle I_{HS\_i\_THS}\rangle$ flowing through the high-side switch S1 during the high-side phase $T_{HS}$, based on the fact that $\langle I_{LX\_i}\rangle \approx \langle I_{HS\_i\_THS}\rangle$ (see again FIG. 6B) during the time interval $T_{HS}$. As exemplified in FIG. 15, the average value accumulation circuit block 90 is coupled to the sensing node 406 and is configured to produce, as a function of the high-side current sensed during $T_{HS}$, a signal at node 902 that is indicative of the average inductor current $\langle I_{LX\_i}\rangle$. Switch 91 is thus controlled by signal $D_{HS}$, i.e., the switching activity of switch 91 is synchronized with the switching activity of the high-side switch S1 (in accordance with the fact that the current is sensed at the high-side switch S1). The resistance of resistor $R_{90}$ is much greater than the resistance of resistor $R_D$ (i.e., $R_{90} \gg R_D$). During the turn-on phase of switch 91 the RC filter $R_{90}$, $C_{90}$ sees an equivalent sawtooth waveform corresponding to the high-side current ramp solely. As a result, voltage $V_{902}$ at node 902 results from sampling and integrating voltage $V_{RD}$ at node 406 over the high-side phase $T_{HS}$, and is thus indicative of the average inductor current $\langle I_{LX\_i}\rangle$:

$$V_{902} = \langle I_{LX\_i}\rangle \cdot R_{onHS} \cdot \frac{R_D}{R_{UP}} = \langle I_{LX\_i}\rangle \cdot R_{onHS} \cdot K$$

As exemplified in FIG. 15, the time average circuit block 92 is configured to produce a signal $V_{IO\_ph\_i}$ at node 922 that is indicative of the average load current $\langle I_{O\_ph\_i}\rangle$. Switch 93 is controlled by signal $D_{LS}$, i.e., the switching activity of switch 93 is synchronized with the switching activity of the low-side switch S2. Switch 94 is controlled by the complement of control signal $D_{LS}$, i.e., the switching activity of switch 94 is synchronized in anti-phase with the switching activity of the low-side switch S2 and switch 93. As a result, voltage $V_{IO\_ph\_i}$ at node 922 is indicative of the average load current $\langle I_{O\_ph\_i}\rangle$, which also corresponds to the average value $\langle I_{LS\_i}\rangle$ of current $I_{LS\_i}$ computed over a complete switching cycle $T_{SW}$:

$$V_{IO\_ph\_i} = V_{902} \cdot \frac{T_{LS}}{T_{SW}} = \langle I_{LX\_i}\rangle \cdot R_{onHS} \cdot K \cdot \frac{T_{LS}}{T_{SW}} =$$
$$\langle I_{LX\_i}\rangle \cdot R_{onHS} \cdot K \cdot (1 - D_{ph\_i}) = R_{onHS} \cdot \langle I_{O\_ph\_i}\rangle \cdot K$$

where $D_{ph\_i}$ is the duty-cycle of converter 144a or 144b, i.e., $D_{ph\_i}=T_{HS}/T_{SW}$.

In a multiphase DC-DC converter architecture such as converter 144 exemplified in FIG. 1, the overall load current $I_O$ can be expressed as the sum of the individual load currents provided by the single phases 144a and 144b: $I_O=I_{O\_ph\_1}+I_{O\_ph\_2}$.

Figure 16:
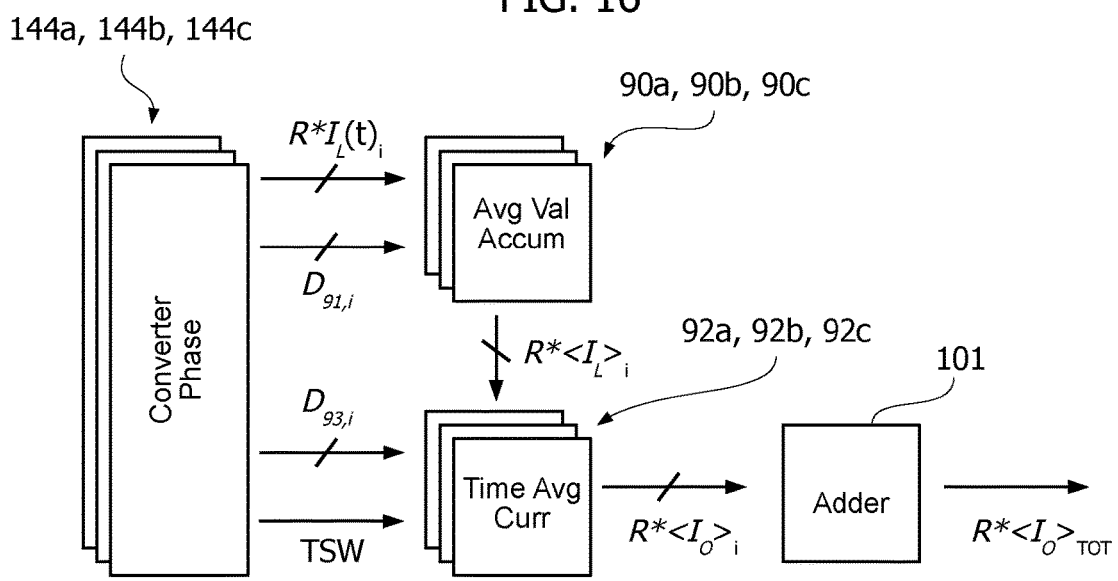
FIG. 16 is a circuit block diagram exemplary of a multiphase DC-DC converter and related load current sensing circuitry according to one or more embodiments of the present description.

Therefore, one or more embodiments may rely on the load current sensing architecture exemplified in FIG. 16. Here, a multiphase converter 144 comprises a plurality of phases 144a, 144b, 144c. Each phase is coupled to a respective average value accumulation circuit block 90a, 90b, 90c configured to receive a respective signal $R*I_L(t)_i$ and to produce a respective signal $R*\langle I_L \rangle_i$ that is indicative of the average inductor current during the sensing period. Each circuit block 90a, 90b, 90c is coupled to a respective time average circuit block 92a, 92b, 92c configured to receive the respective signal indicative of the average inductor current and to produce a respective signal $R*\langle I_O \rangle_i$ that is indicative of the respective average load current. Depending on the converter topology, blocks 92a, 92b, 92c can be omitted (e.g., if the converter is a buck converter). Further, an adder circuit 101 may be provided to sum the individual contributions from circuits 92a, 92b, 92c and produce an output voltage signal $R*\langle I_O \rangle_{TOT}$ indicative of the total load current $I_O$.

Figure 17:
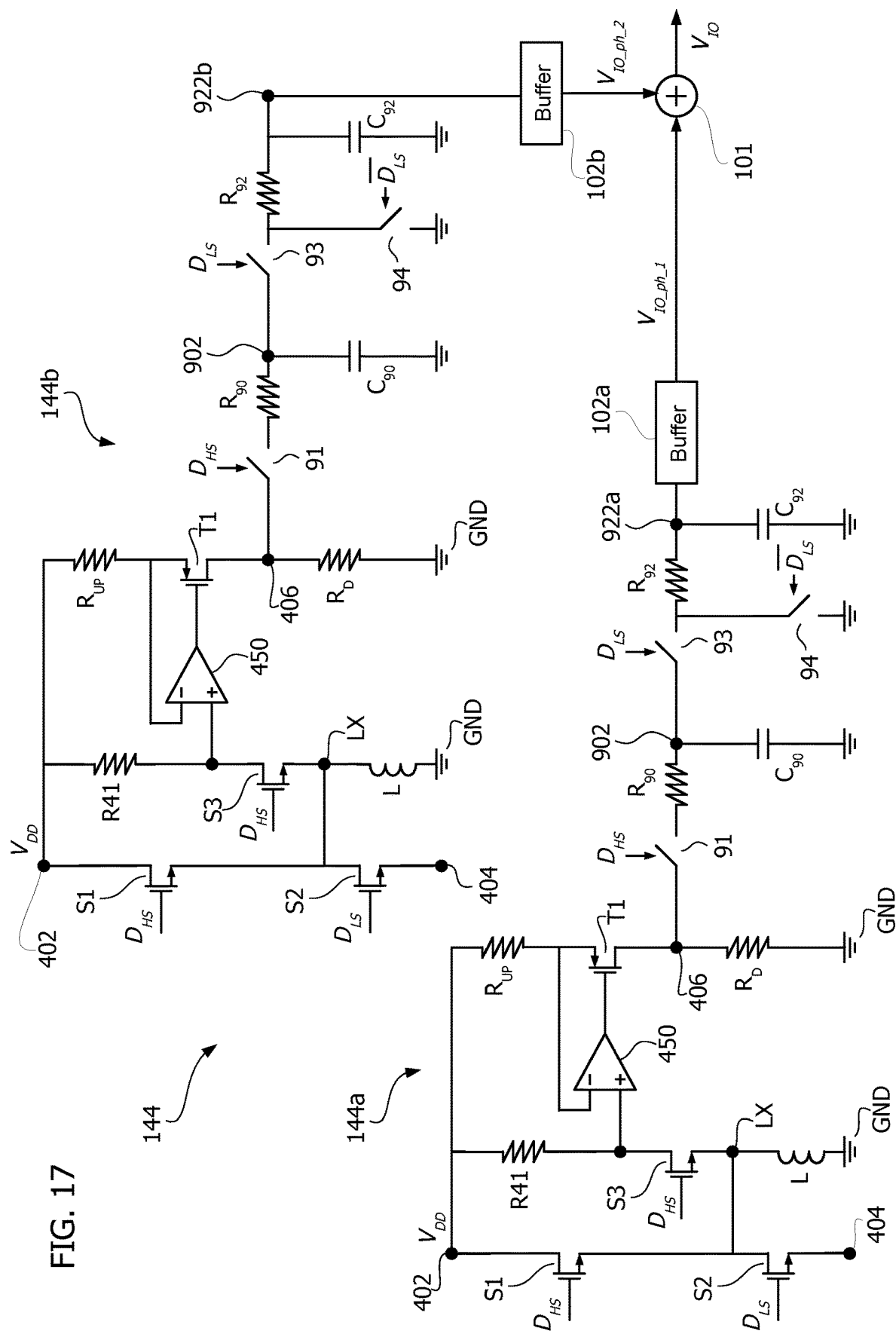
FIG. 17 is a circuit block diagram exemplary of a multiphase DC-DC inverting buck-boost converter and related high-side current sensing circuitry according to one or more embodiments of the present description.

For instance, as exemplified in FIG. 17, a simple solution for producing an output voltage signal $V_{IO}$ indicative of the total load current $I_O$ may rely on providing each of the single-phase converters 144a and 144b with a respective load current measuring arrangement as exemplified in FIG. 9, and sum the individual load values (i.e., the individual contributions $V_{IO\_ph\_1}$ and $V_{IO\_ph\_2}$ due to each phase of converter 144) at an adder circuit 101 to produce the output signal $V_{IO}$. Optionally, the signals output from nodes 922a and 922b can be buffered by respective buffers 102a and 102b before being fed to the adder circuit 101 so as to improve the measurement accuracy. The cost (in terms of electrical components and thus silicon area) of the solution exemplified in FIG. 17 is four RC filters, six switches with independent control, four buffers (including the two buffers downstream of nodes 902, not visible in FIG. 17), and one adder circuit. Advantageously, the two load current sensing circuits of converters 144a and 144b are not tied together and therefore the solution exemplified in FIG. 17 is very flexible. For instance, one or more embodiments as exemplified in FIG. 17 allow the two converters 144a and 144b to operate in different regions, with different control loop, and/or to sink different current values.

Figure 18:
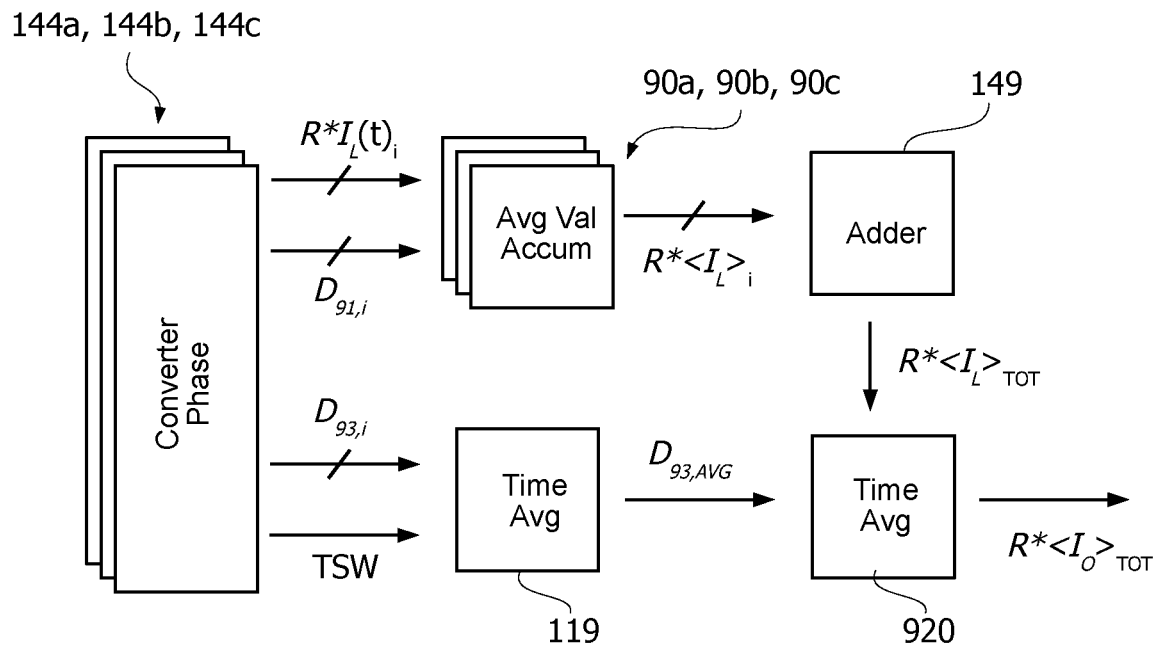
FIG. 18 is a circuit block diagram exemplary of a multiphase DC-DC converter and related load current sensing circuitry according to one or more embodiments of the present description.

Alternatively, one or more embodiments may rely on the sensing architecture exemplified in FIG. 18, provided that the two (or more) single-phase converters share the same switching frequency (or switching period $T_{SW}$). Here, a multiphase converter 144 comprises a plurality of phases 144a, 144b, 144c. Each phase is coupled to a respective average value accumulation circuit block 90a, 90b, 90c configured to receive a respective signal $R*I_L(t)_i$ and to produce a respective signal $R*\langle I_L \rangle_i$ that is indicative of the average inductor current during the sensing period. An adder circuit 149 is provided to sum the individual contributions $R*\langle I_L \rangle_i$ from circuits 90a, 90b, 90c and produce an output signal $R*\langle I_L \rangle_{TOT}$ indicative of the sum of the average inductor currents. A circuit 119 is configured to produce a signal $D_{93,AVG}$ indicative of an equivalent time average value. A single time average circuit block 920 is configured to receive the summed average inductor current signal $R*\langle I_L \rangle_{TOT}$ and the equivalent time average value $D_{93,AVG}$ to produce an output voltage signal $R*\langle I_O \rangle_{TOT}$ indicative of the total load current $I_O$.

The architecture of FIG. 18 may thus be designed to merge (e.g., unify) the information from the independent, single phases of the converter 144 to measure the overall load current $I_O$ by determining an equivalent output signal $V_{IO\_ph\_eq}$ (indicative of an equivalent inductor current $I_{O\_ph\_eq}$) and an equivalent duty-cycle $D_{ph\_eq}$, i.e., the inductor current value and duty-cycle value that would cause a single inverting buck-boost converter to produce the same load current $I_O$, as indicated by the following equation:

$$\begin{aligned}
V_{IO\_ph\_eq} &= V_{IO\_ph\_1} + V_{IO\_ph\_2} \\
&= \langle I_{LX\_1} \rangle \cdot R_{onHS,1} \cdot K \cdot (1 - D_{ph\_1}) + \\
&\quad \langle I_{LX\_2} \rangle \cdot R_{onHS,2} \cdot K \cdot (1 - D_{ph\_2}) \\
&\approx R_{onHS} \cdot K \cdot (\langle I_{LX\_1} \rangle + \langle I_{LX\_2} \rangle)(1 - D_{ph\_eq}) \\
&= R_{onHS} \cdot K \cdot \langle I_{LX\_eq} \rangle (1 - D_{ph\_eq}) = R_{onHS} \cdot K \cdot I_{O\_ph\_eq}
\end{aligned}$$

Figure 19:
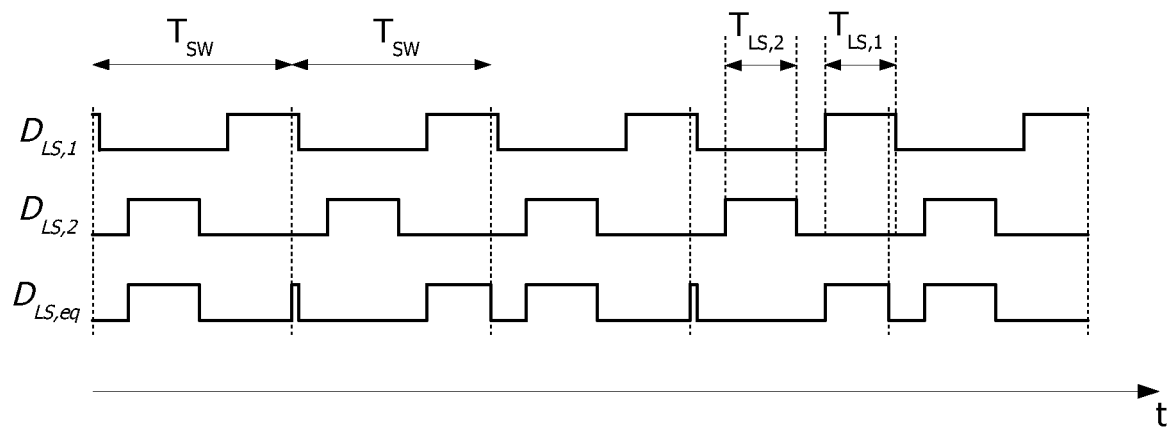
FIG. 19 is a time diagram exemplary of possible time evolution of low-side control signals in a multiphase DC-DC inverting buck-boost converter according to one or more embodiments of the present description.

One or more embodiments may thus rely on the approach of summing the independent average coil currents $\langle I_{LX\_1} \rangle$ and $\langle I_{LX\_2} \rangle$ to produce signal $\langle I_{LX\_eq} \rangle$, and multiplying this signal to a custom time average that is the average of the low-side control. To this regard, reference may be made to FIG. 19, which is a time diagram exemplary of a possible time evolution of the low-side control signal $D_{LS,1}$ applied to the first converter (or first phase) 144a, the low-side control signal $D_{LS,2}$ applied to the second converter (or second phase) 144b, and an equivalent low-side control signal $D_{LS,eq}$ that substantially corresponds to $D_{LS,1}$ or $D_{LS,2}$ alternatively at each switching period $T_{SW}$ (e.g., $D_{LS,eq}=D_{LS,2}$ during odd-numbered periods and $D_{LS,eq}=D_{LS,1}$ during even-numbered periods). As a result, the quantity $1-D_{ph\_eq}$ (i.e., the complement of the equivalent duty-cycle $D_{ph\_eq}$ of signal $D_{LS,eq}$) can be computed as:

$$1 - D_{ph\_eq} = \frac{T_{LS,1} + T_{LS,2}}{2 \cdot T_{SW}}$$

where $T_{LS,1}$ and $T_{LS,2}$ are the durations of the low-side pulses of converters 144a and 144b.

Figure 20:
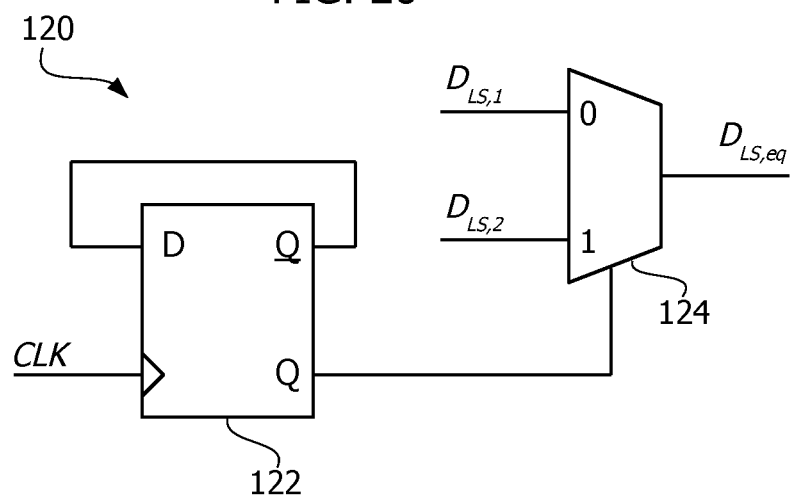
FIG. 20 is a circuit block diagram exemplary of a circuit for producing a low-side control signal according to one or more embodiments of the present description.

The equivalent low-side control signal $D_{LS,eq}$ may be produced by a circuit 120 as exemplified in FIG. 20. Circuit 120 comprises a D flip-flop (data flip-flop) 122 and a multiplexer 124. The D flip-flop receives the converter clock signal CLK at its clock input terminal. The inverted data output Q of the D flip-flop 122 is fed back to the data input D of the D flip-flop 122. The data output Q of the D flip-flop 122 is provided as a selection signal to the multiplexer 124. The multiplexer 124 receives as a first input signal the low-side control signal $D_{LS,1}$ and as a second input signal the low-side control signal $D_{LS,2}$. Therefore, the D flip-flop 122 may be configured to divide the clock frequency, while the multiplexer 124 may alternatively select and propagate to its output the control signals $D_{LS,1}$ and $D_{LS,2}$ to produce the equivalent control signal $D_{LS,eq}$.

Figure 21:
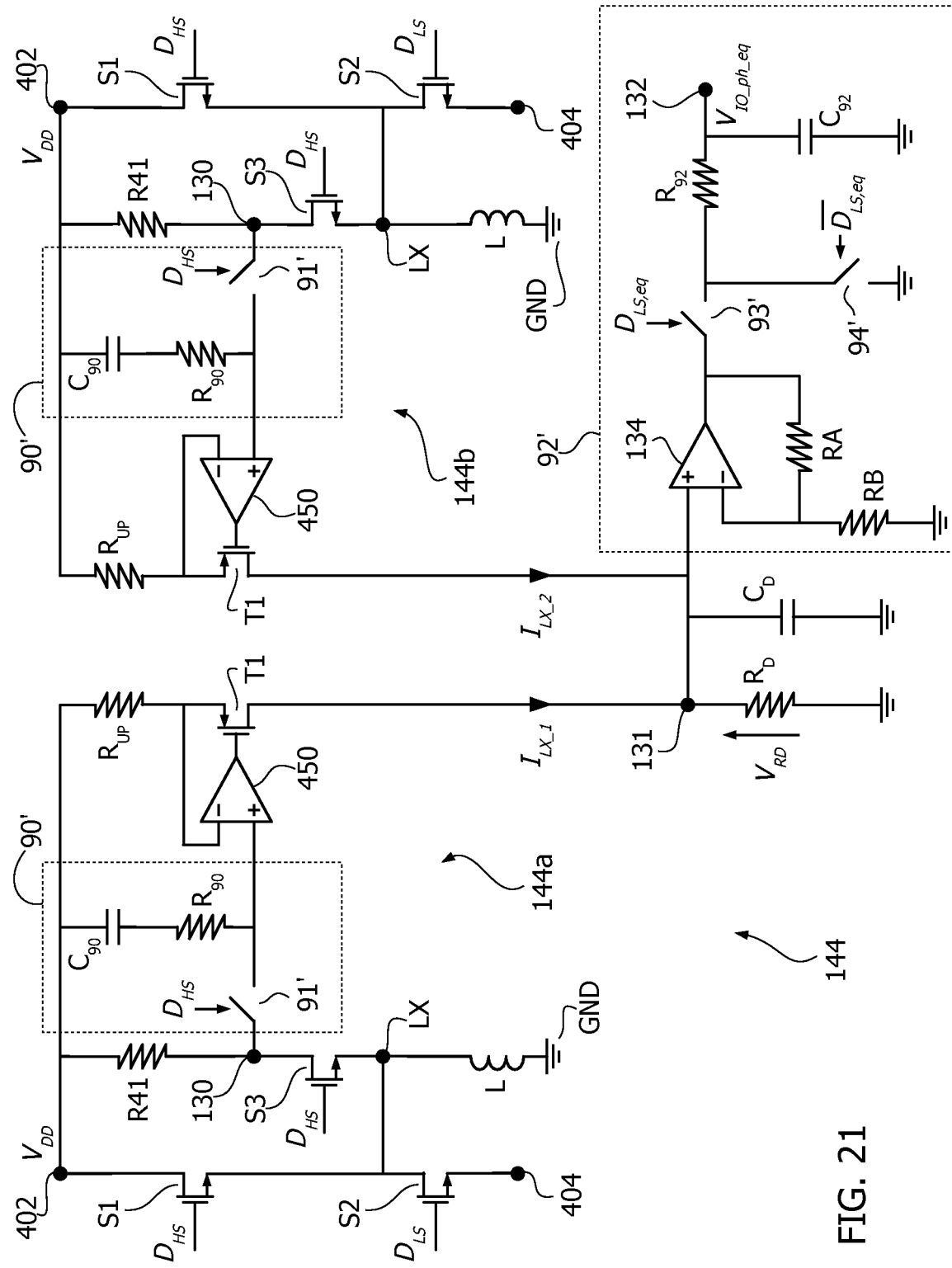
FIG. 21 is a circuit block diagram exemplary of another multiphase DC-DC inverting buck-boost converter and related high-side current sensing circuitry according to one or more embodiments of the present description.

FIG. 21 is a circuit block diagram exemplary of one or more embodiments of an inverting buck-boost converter 144 relying on the general principle discussed with reference to FIG. 18. In particular, the converter 144 exemplified in FIG. 21 includes an architecture that is configured to merge the currents $I_{LX\_1}$ and $I_{LX\_2}$ output by each phase 144a and 144b of the converter 144.

Therefore, the single-phase converters 144a and 144b exemplified in FIG. 21 differ from the single-phase converter exemplified in FIGS. 4 and 15 in that average value accumulation circuit blocks 90' are arranged upstream of the respective buffers 450. Therefore, in one or more embodiments as exemplified in FIG. 21, each single-phase converter 144a, 144b may comprise an average value accumulation circuit block 90' coupled between switch S3 and the non-inverting input of buffer 450. The circuit block 90' includes a switch 91', a resistor $R_{90}$ and a capacitor $C_{90}$. Switch 91' has a first terminal coupled to node 130 intermediate switch S3 and resistor R41, and a second terminal coupled to the non-inverting input terminal of buffer 450, and is configured to receive control signal $D_{HS}$ to be controlled thereby, i.e., the switching activity of switch 91' is synchronized with the switching activity of the high-side switch S1. Resistor $R_{90}$ has a first terminal coupled to the second terminal of switch 91', and a second terminal coupled to a first terminal of capacitor $C_{90}$. Capacitor $C_{90}$ has a second terminal coupled to the input node 402 and forms an RC filter circuit with resistor $R_{90}$. In one or more embodiments as exemplified in FIG. 21, thus, the sum of the average inductor currents is carried out by adding currents $\langle I_{LX\_1}\rangle$ and $\langle I_{LX\_2}\rangle$ at node 131 via resistor $R_D$ and capacitor CD coupled between node 131 and ground node GND. Arranging the average value accumulation circuit blocks 90' upstream of the buffers 450 allows replicating the instantaneous current $I_{LX\_i}$ during the converter high-side-on phase, while the average current keeps flowing during the converter high-side-off phase.

As a result, the voltage drop $V_{RD}$ across resistor $R_D$ (i.e., the voltage at node 131) is indicative of the sum of the average inductor currents $\langle I_{LX\_i}\rangle$:

$$V_{RD} = (I_{HS\_1}(t) + I_{HS\_2}(t)) \cdot R_{onHS} \cdot \frac{R_D}{R_{UP}}$$

As exemplified in FIG. 21, the converter 144 may comprise a single time average circuit block 92' coupled to node 131 and configured to produce a signal at node 132 that is indicative of the equivalent load current $I_{O\_ph\_eq}$. The circuit block 92' includes a buffer circuit 134 (e.g., an amplifier such as an operational amplifier), a resistive feedback network including resistors RA and RB, a first switch 93', a second switch 94', a resistor $R_{92}$ and a capacitor $C_{92}$. Buffer 134 has a first (e.g., non-inverting) input terminal coupled to node 131 and a second (e.g., inverting) input terminal coupled to the first terminal of resistor RB. Resistor RB has a second terminal coupled to ground node GND. Resistor RA has a first terminal coupled to the second input terminal of buffer 134 and a second terminal coupled to the output terminal of buffer 134. Switch 93' has a first terminal coupled to the output terminal of buffer 134 and a second terminal coupled to the first terminal of resistor $R_{92}$, and is configured to receive the control signal $D_{LS,eq}$ to be controlled thereby. Switch 94' has a first terminal coupled to the second terminal of switch 93' and a second terminal coupled to ground node GND, and is configured to receive the complement of control signal $D_{LS,eq}$ to be controlled thereby. Resistor $R_{92}$ has a second terminal coupled to node 132. Capacitor $C_{92}$ is coupled between node 132 and ground node GND and forms an RC filter circuit with resistor $R_{92}$. As a result, voltage $V_{IO\_ph\_eq}$ at node 132 is indicative of the average load current $I_O$:

$$V_{IO\_ph\_eq} = V_{RD} \cdot \left(1 + \frac{RA}{RB}\right) \cdot \frac{T_{LS,1} + T_{LS,2}}{2 \cdot T_{SW}}$$

$$= (I_{HS\_1}(t) + I_{HS\_2}(t)) \cdot R_{onHS} \cdot \frac{R_D}{R_{UP}} \cdot$$

$$\left(1 + \frac{RA}{RB}\right) \cdot \frac{T_{LS,1} + T_{LS,2}}{2 \cdot T_{SW}}$$

$$= I_{O\_ph\_eq} \cdot R_{onHS} \cdot K \cdot \left(1 + \frac{RA}{RB}\right)$$

The cost (in terms of electrical components and thus silicon area) of the solution exemplified in FIG. 13 is three RC filters, four switches with independent control, and one buffer.

Figure 22:
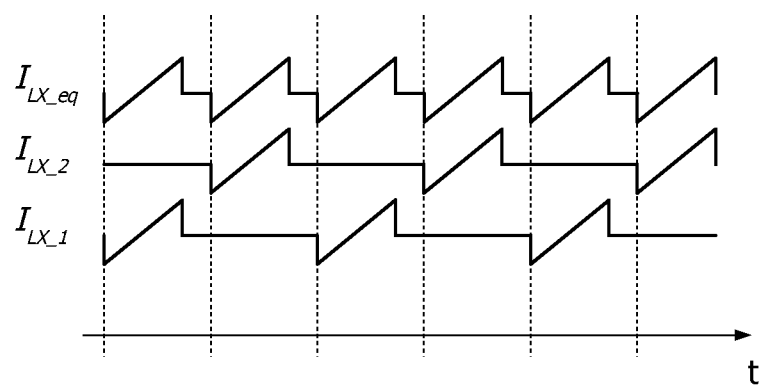
FIG. 22 is a time diagram exemplary of possible time evolution of the inductor currents in a multiphase DC-DC inverting buck-boost converter as exemplified in FIG. 21.

FIG. 22 is a time diagram exemplary of possible time evolution of the current signals $I_{LX\_1}$, $I_{LX\_2}$ and $I_{Lx\_eq}$ in one or more embodiments as exemplified in FIG. 21.

Figure 23:
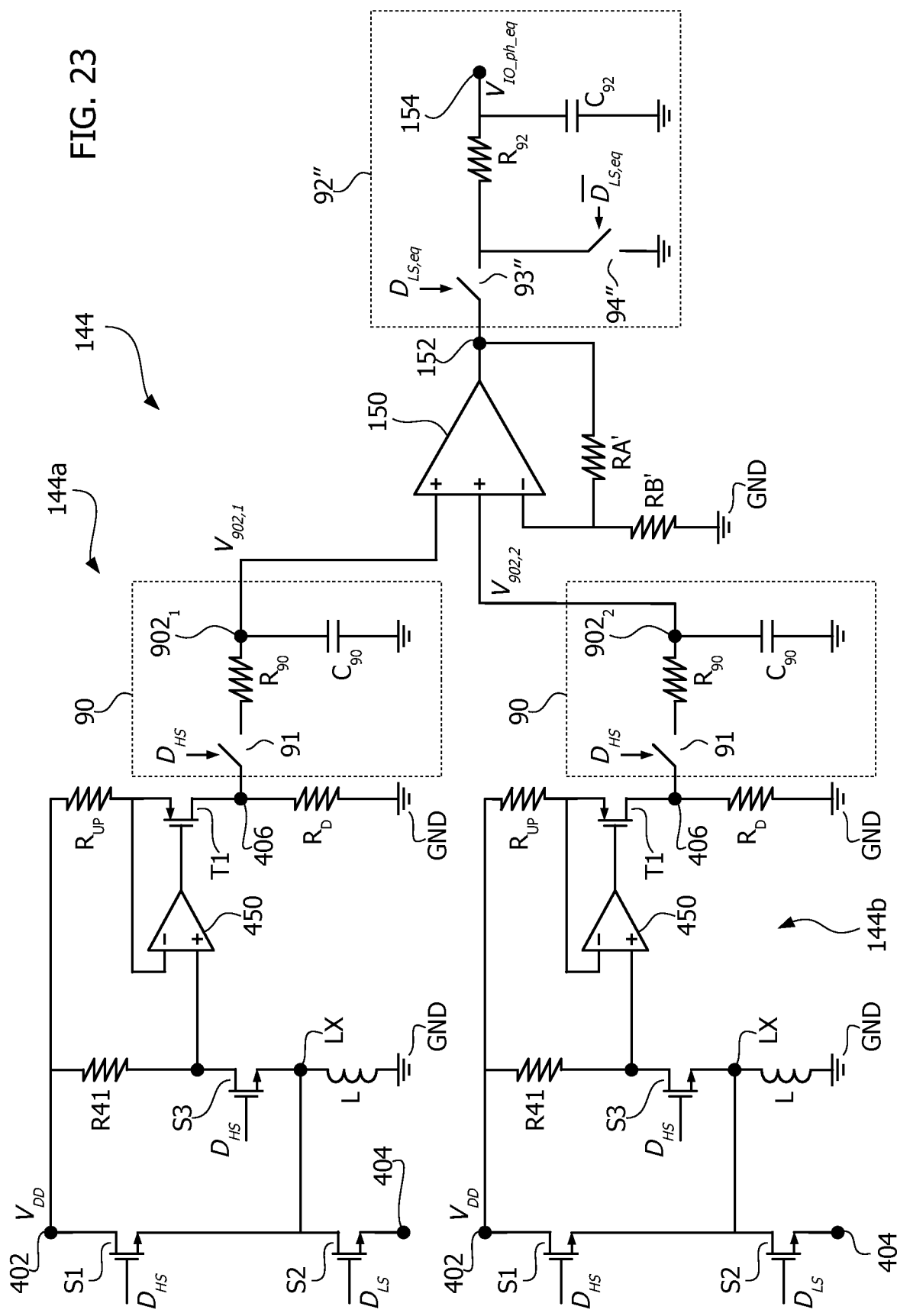
FIG. 23 is a circuit block diagram exemplary of another multiphase DC-DC inverting buck-boost converter and related high-side current sensing circuitry according to one or more embodiments of the present description.

FIG. 23 is another circuit block diagram exemplary of one or more embodiments of an inverting buck-boost converter 144 relying on the general principle discussed with reference to FIG. 18. In particular, the converter 144 exemplified in FIG. 23 includes an architecture that is configured to merge the voltages $V_{902,1}$ and $V_{902,2}$ output by each sensing circuit of the phases 144a and 144b of the converter 144.

Therefore, the single-phase converters 144a and 144b exemplified in FIG. 23 differ from the single-phase converter exemplified in FIGS. 4 and 15 in that they do not include respective time average circuit blocks 92. A single time average circuit block 92" is arranged downstream of an adder circuit 150. Therefore, in the embodiments exemplified in FIG. 23, each single-phase converter 144a, 144b may comprise a respective current sensing architecture substantially as disclosed with reference to FIG. 15, except for the time average circuit block 92.

As exemplified in FIG. 23, the converter 144 may comprise an adder circuit 150 configured to sum the voltage signal $V_{902,1}$ at node $902_1$ and the voltage signal $V_{902,2}$ at node $902_2$. The adder circuit 150 may comprise a first positive input terminal coupled to node $902_1$, a second positive input terminal coupled to node $902_2$, and a negative (feedback) input terminal coupled to a resistive feedback network. The feedback network may comprise a resistor RA' coupled between the negative input terminal and the output terminal 152 of the adder circuit 150, and a resistor RB' coupled between the negative input terminal of the adder circuit 150 and ground node GND. Further details on possible implementations of the adder circuit 150 are discussed in the following, with reference to FIGS. 24 to 28.

The converter 144 as exemplified in FIG. 23 may comprise a single time average circuit block 92" coupled to node 152 and configured to produce a signal $V_{IO\_ph\_eq}$ at node 154 that is indicative of the equivalent load current $I_{O\_ph\_eq}$. The circuit block 92" includes a first switch 93", a second switch 94", a resistor $R_{92}$ and a capacitor $C_{92}$. Switch 93" has a first terminal coupled to the output terminal 152 of adder 150 and a second terminal coupled to the first terminal of resistor $R_{92}$, and is configured to receive the control signal $D_{LS,eq}$ to be controlled thereby. Switch 94" has a first terminal coupled to the second terminal of switch 93" and a second terminal coupled to ground node GND, and is configured to receive the complement of control signal $D_{LS,eq}$ to be controlled thereby. Resistor $R_{92}$ has a second terminal coupled to node 154. Capacitor $C_{92}$ is coupled between node 154 and ground node GND and forms an RC filter circuit with resistor $R_{92}$. As a result, voltage $V_{IO\_ph\_eq}$ at node 154 is indicative of the average load current $I_O$:

$$V_{IO\_ph\_eq} = (\langle I_{LX\_1}\rangle + \langle I_{LX\_2}\rangle) \cdot R_{onHS} \cdot$$

$$\frac{R_D}{R_{UP}} \cdot \left(1 + \frac{RA'}{RB'}\right) \cdot \frac{T_{LS,1} + T_{LS,2}}{2 \cdot T_{SW}}$$

$$= \langle I_{LX\_eq}\rangle \cdot R_{onHS} \cdot K \cdot \left(1 + \frac{RA'}{RB'}\right) \cdot \frac{T_{LS,1} + T_{LS,2}}{2 \cdot T_{SW}}$$

$$= I_{O\_ph\_eq} \cdot R_{onHS} \cdot K \cdot \left(1 + \frac{RA'}{RB'}\right)$$

The cost (in terms of electrical components and thus silicon area) of the solution exemplified in FIG. 23 is three RC filters, four switches with independent control, and one buffer.

In one or more embodiments, the adder circuit 150 may include an analog adder circuit having an architecture based on the recognition that the middle point (or center point) of a resistive star configuration produces a voltage signal that is the average of the voltage signals applied to the vertices of the star configuration, provided that the resistors are matched (i.e., they have the same resistance value).

Figure 24:
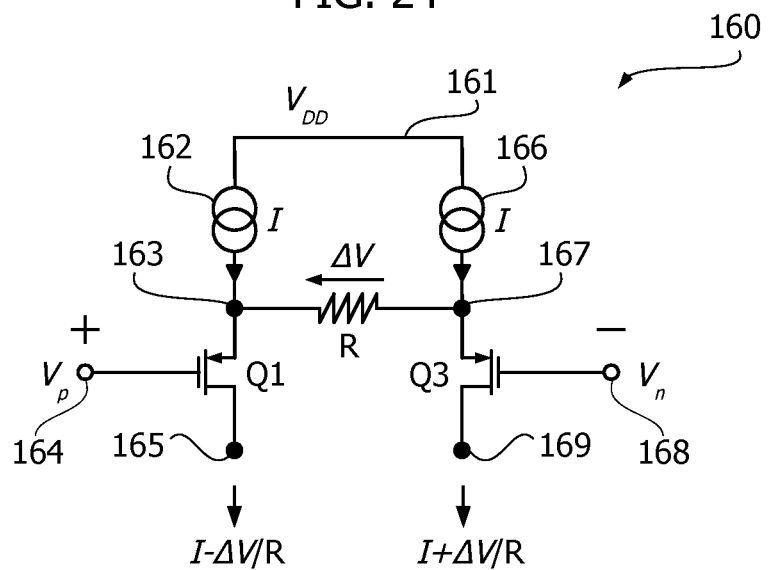
FIG. 24 is a circuit block diagram exemplary of a differential input circuit for use in an adder circuit according to one or more embodiments of the present description.

In one or more embodiments, an analog adder circuit may include one or more instances of a differential circuit 160 as exemplified in FIG. 24. Circuit 160 comprises a first current flow line arranged between a supply rail 161 (e.g., providing a supply voltage $V_{DD}$) and a first current output node 165. The first current flow line comprises a current source 162 (e.g., current generator) and a p-channel MOS transistor Q1 arranged between the supply rail 161 and the output node 165. Current source 162 is arranged between the supply rail 161 and node 163 and is configured to inject (e.g., source) current I into node 163. Transistor Q1 has a source terminal coupled to node 163, a drain terminal coupled to the output node 165, and a gate terminal coupled to an input node 164 to receive a first input signal $V_p$. Circuit 160 comprises a second current flow line arranged between the supply rail 161 and a second current output node 169. The second current flow line comprises a current source 166 (e.g., current generator) and a p-channel MOS transistor Q3 arranged between the supply rail 161 and the output node 169. Current source 166 is arranged between the supply rail 161 and node 167 and is configured to inject (e.g., source) current I into node 167. Transistor Q3 has a source terminal coupled to node 167, a drain terminal coupled to the output node 169, and a gate terminal coupled to an input node 168 to receive a second input signal $V_n$. A resistor R is arranged between nodes 163 and 167 (i.e., between the source terminals of transistors Q1 and Q3). $\Delta V$ being the voltage difference between nodes 163 and 167, a current $\Delta V/R$ flows through resistor R from node 163 to node 167 (i.e., it is sunk from node 163 and sourced to node 167). As a result, node 165 outputs a current equal to $I-\Delta V/R$ and node 169 outputs a current equal to $I+\Delta V/R$.

Figure 25:
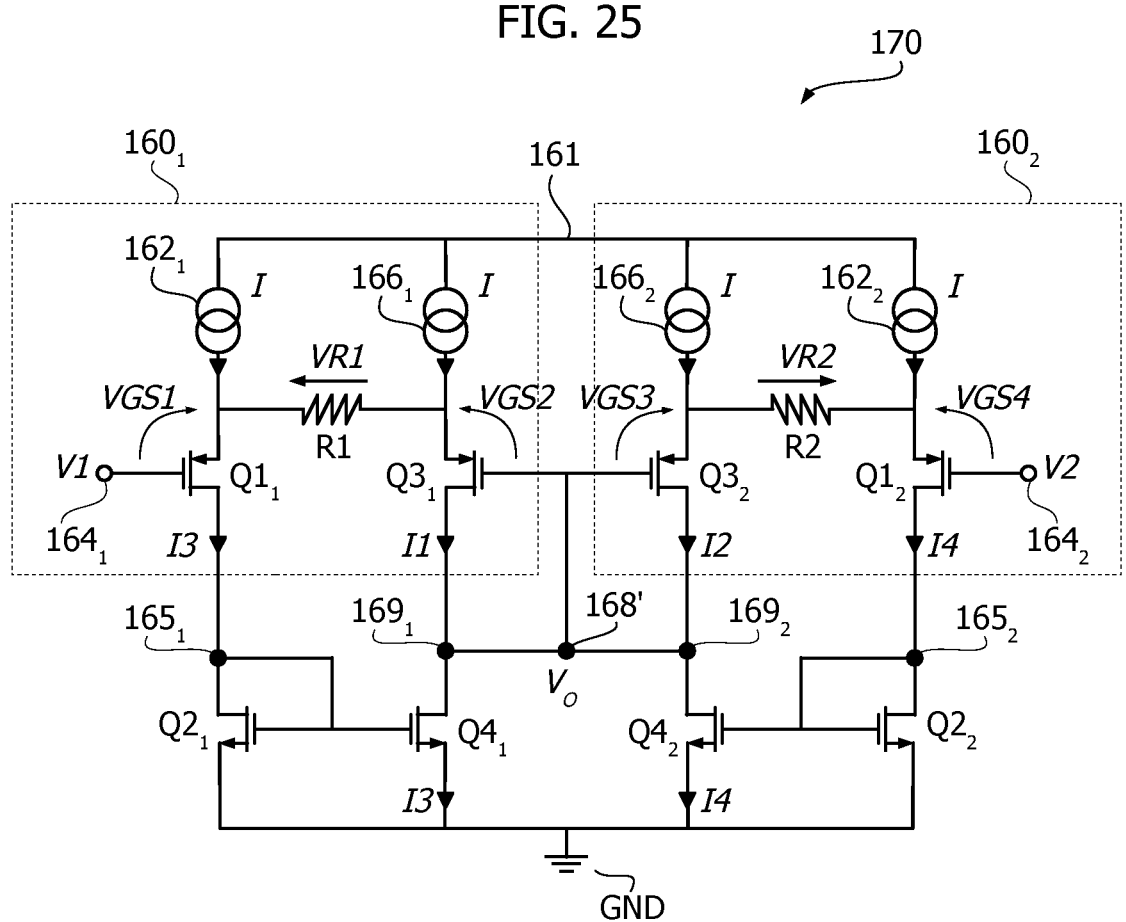
FIG. 25 is a circuit block diagram exemplary of a signal averaging circuit according to one or more embodiments of the present description.

FIG. 25 is a circuit block diagram exemplary of a circuit 170 that produces an output signal $V_O$ that is the average of two input signals V1 and V2. Circuit 170 includes two instances 160$_1$, 160$_2$ of the differential circuit 160 arranged as discussed in the following. The first differential circuit 160$_1$ is configured to receive the first input signal V1 at its input node 164$_1$, and the second differential circuit 160$_2$ is configured to receive the second input signal V2 at its input node 164$_2$. Nodes 168$_1$ and 168$_2$ of circuits 160$_1$ and 160$_2$ are connected one to the other and provide a common node 168' where the output (average) signal $V_O$ is produced. Further, nodes 169$_1$ and 169$_2$ are connected to node 168'. R1 being the resistor coupled between the source terminals of transistors Q1$_1$ and Q3$_1$ and VR1 the voltage drop across resistor R1, transistor Q1$_1$ outputs a current I3=I−VR1/R1 and transistor Q3$_1$ outputs a current I1=I+VR1/R1. Being R2 the resistor coupled between the source terminals of transistors Q1$_2$ and Q3$_2$ and VR2 the voltage drop across resistor R2, transistor Q1$_2$ outputs a current I4=I−VR2/R2 and transistor Q3$_2$ outputs a current I2=I+VR2/R2.

Circuit 170 further includes a first current mirror circuit arranged between nodes 165$_1$ and 169$_1$ and ground node GND. The first current mirror circuit is configured to sink from node 169$_1$ a current I3 equal to the current I3 output from node 165$_1$ of circuit 160$_1$. In particular, the first current mirror includes an n-channel MOS transistor Q2$_1$ and an n-channel MOS transistor Q4$_1$. Transistor Q2$_1$ is diode-connected and has a drain terminal coupled to node 165$_1$ and a source terminal coupled to ground node GND. Transistor Q4$_1$ has a drain terminal coupled to node 169$_1$ and a source terminal coupled to ground node GND. The gate terminals of transistors Q2$_1$ and Q4$_1$ are coupled one to the other.

Circuit 170 further includes a second current mirror circuit arranged between nodes 165$_2$ and 169$_2$ and ground node GND. The second current mirror circuit is configured to sink from node 169$_2$ a current I4 equal to the current I4 output from node 165$_2$ of circuit 160$_2$. In particular, the second current mirror includes an n-channel MOS transistor Q2$_2$ and an n-channel MOS transistor Q4$_2$. Transistor Q2$_2$ is diode-connected and has a drain terminal coupled to node 165$_2$ and a source terminal coupled to ground node GND. Transistor Q4$_2$ has a drain terminal coupled to node 169$_2$ and a source terminal coupled to ground node GND. The gate terminals of transistors Q2$_2$ and Q4$_2$ are coupled one to the other.

At node 168' the currents I1, I2, I3 and I4 are combined (e.g., added and subtracted) so that node 168' produces a voltage $V_O$ that is the average value of V1 and V2. In particular, circuit 170 may force voltage VR1=(V1−$V_O$+K1) across resistor R1, and voltage VR2=(V2−$V_O$−K2) across resistor R2, where K1=VGS1−VGS2 and K2=VGS3−VGS4 (VGS1, VGS2, VGS3 and VGS4 being the gate-source voltages of transistors Q1$_1$, Q3$_1$, Q3$_2$ and Q1$_2$, respectively, as indicated in FIG. 17). The output voltage $V_O$ is stable thanks to the current feedback in node 168'. The current condition in node 168' imposes I1+I2=I3+I4, and the loops impose I1=I4 and I2=I3. Therefore, the following equations apply:

$$I1 = I + \frac{VR1}{R1} = I + \frac{V1 + VGS1 - V_O - VGS2}{R1}$$

$$I2 = I + \frac{VR2}{R2} = I + \frac{V2 + VGS4 - V_O - VGS3}{R2}$$

$$I3 = I - \frac{VR1}{R1} = I - \frac{V1 + VGS1 - V_O - VGS2}{R1}$$

$$I4 = I - \frac{VR2}{R2} = I - \frac{V2 + VGS4 - V_O - VGS3}{R2}$$

Using the above identity I1+I2=I3+I4, the current I can be removed from the equations above, since it is in common with all of them. The following equation thus applies:

$$\frac{V1 + VGS1 - V_O - VGS2}{R1} +$$
$$\frac{V2 + VGS4 - V_O - VGS3}{R2} = -\frac{V1 + VGS1 - V_O - VGS2}{R1} -$$

-continued $$\frac{V2 + VGS4 - V_O - VGS3}{R2}$$

which leads to:

R2·V1+R2·VGS1−R2·V_O−R2·VGS2+R1·V2+
R1·VGS4−R1·V_O−R1·VGS3= which in turn leads to:

$$V_O = R2 \cdot \frac{V1 + VGS1 - VGS2}{R1 + R2} + R1 \cdot \frac{V2 + VGS4 - VGS3}{R1 + R2}$$

Assuming that R1=R2, the following equation applies:

$$V_O = \frac{V1 + VGS1 - VGS2 + V2 + VGS4 - VGS3}{2} = \frac{V1 + V2 + \varepsilon}{2}$$

where

ε=VGS1−VGS2+VGS4−VGS3

Since the matching of the parameters can be designed to minimize the difference F (i.e., ε≈0 V), the following equation may apply:

$$V_O = \frac{V1 + V2}{2}$$

Therefore, the voltage signal $V_O$ at node 168' may be equal to the average of voltage signals V1 and V2.

Since the average of two signals is a scaled sum, it is possible to implement an adder circuit by including a gain stage to apply a gain to signal $V_O$. However, the circuit 170 exemplified in FIG. 25 may not be suitable to implement such a gain stage, because it may not be capable to drive a low impedance load. For instance, if a resistor or a current generator (acting like a load) were to be connected to node 168', an offset in the current balance may be generated.

Figure 26:
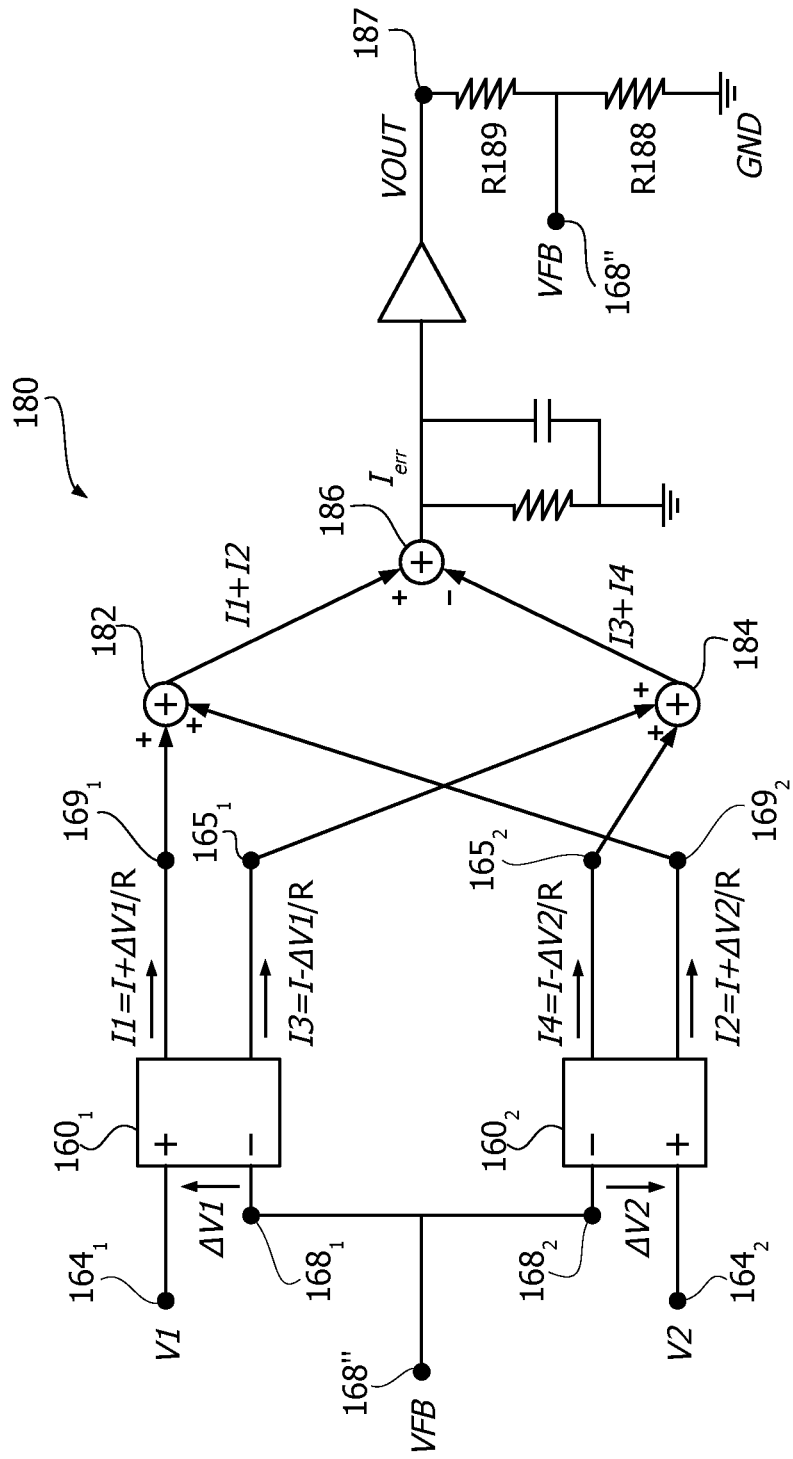
FIG. 26 is a circuit block diagram exemplary of the architecture of an adder circuit according to one or more embodiments of the present description.

In order to provide the current needed to the load, a high impedance driver may be used. To this aim, an adder circuit architecture as exemplified in FIG. 26 may be resorted to. In particular, the architecture exemplified in FIG. 26 is advantageous insofar as it facilitates decoupling the dynamics of the current adder/subtractor nodes, thereby allowing for a gain stage to be applied to the output node.

In particular, the adder circuit 180 exemplified in FIG. 26 comprises two instances 160$_1$, 160$_2$ of the differential circuit 160 arranged as discussed in the following. The first differential circuit 160$_1$ is configured to receive the first input signal V1 at its input node 164$_1$, and the second differential circuit 160$_2$ is configured to receive the second input signal V2 at its input node 164$_2$. Nodes 168$_1$ and 168$_2$ of circuits 160$_1$ and 160$_2$ are connected one to the other and provide a common node 168" where the average signal VFB=(V1+V2)/2 is produced. Node 165$_1$ outputs a current I3=I−ΔV1/R and node 169$_1$ outputs a current I1=I+ΔV1/R, where ΔV1=V1−VFB; node 165$_2$ outputs a current I4=I−ΔV2/R and node 169$_2$ outputs a current I2=I+ΔV2/R, where ΔV2=V2−VFB. It is supposed here that the resistors included in the circuits 160$_1$, 160$_2$ have the same resistance value R, and that the gate-source voltages of the input transistors of circuits 160$_1$, 160$_2$ are matched so that they can be neglected (i.e., ε≈0 V). A first current adder node 182 is configured to sum the currents I1 and I2 output from nodes 169$_1$ and 169$_2$, thereby producing a current equal to 2I+(ΔV1+ΔV2)/R, and a second current adder node 184 is configured to sum the currents I3 and I4 output from nodes 165$_1$ and 165$_2$, thereby producing a current equal to 2I−(ΔV1+ΔV2)/R. A current subtractor node 186 is configured to subtract the output current of adder node 184 from the output current of adder node 182, thereby producing a current error signal $I_{err}$ equal to 2*(ΔV1+ΔV2)/R=2*(V1−VFB+V2−VFB)/R. The adder circuit 180 may further comprise an RC filter circuit coupled to the output of subtractor node 186. The error current output from subtractor node 186 is forced to flow through the resistor of the RC filter and produces a voltage error signal. The adder circuit 180 may further comprise a buffer circuit coupled downstream of the RC filter to decouple the node dynamics, and a gain stage at the output of the buffer circuit (e.g., a voltage ladder coupled between the output of the buffer circuit and ground node GND) to add a gain factor to the average signal VFB to produce the output sum signal VOUT at node 187. The voltage error signal is thus buffered and amplified. In particular, still with reference to FIG. 26, the following equations apply:

$$VOUT = 1 + \frac{R189}{R188} \cdot VFB$$

$$VFB = \frac{V1 + V2}{2}$$

In one or more embodiments where the feedback resistors R188 and R189 are equal (R188=R189), the output signal VOUT thus provides the sum of the input signals V1 and V2: VOUT=V1+V2.

Figure 27:
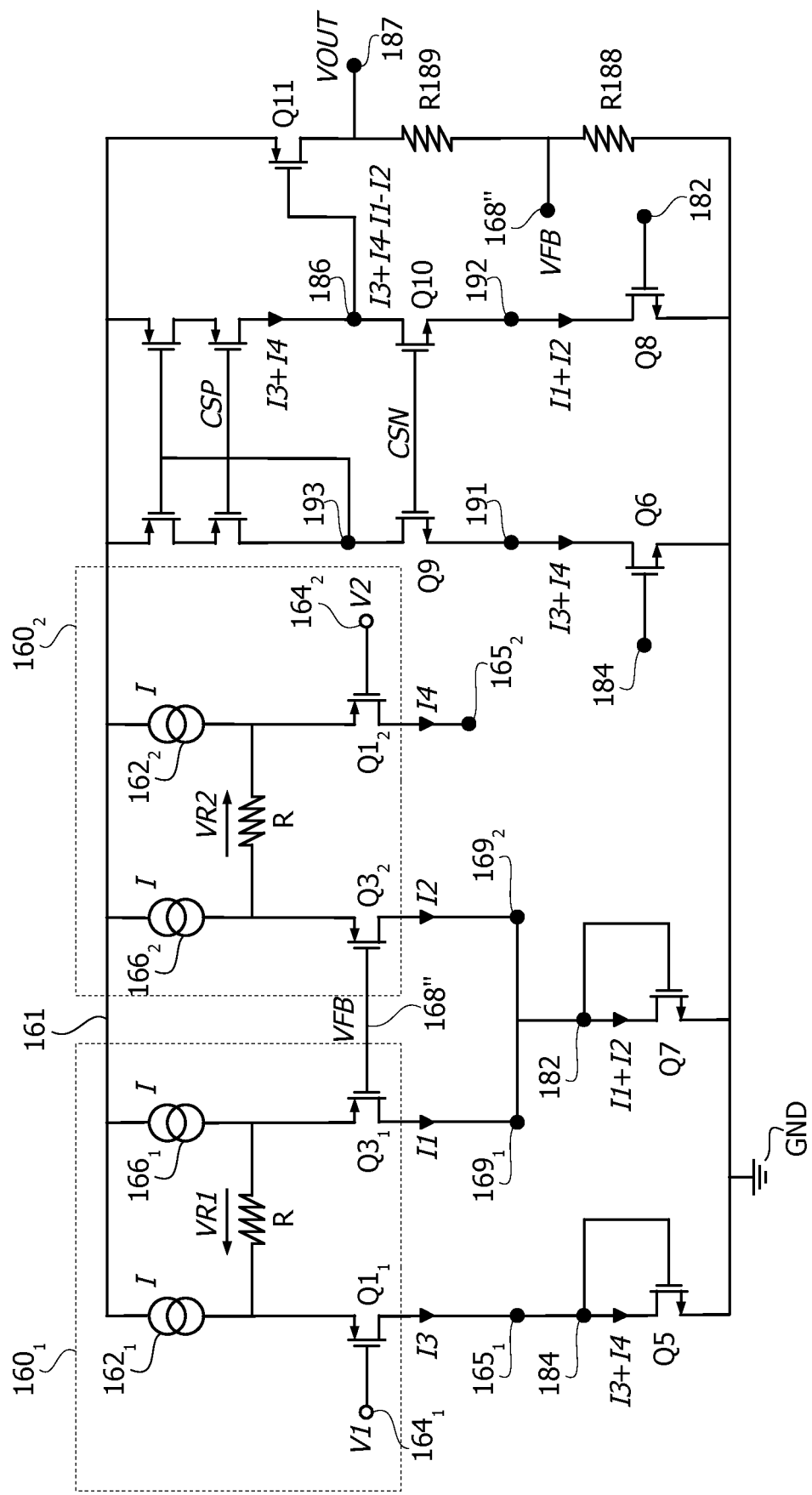
FIG. 27 is a circuit block diagram exemplary of a possible implementation of the adder circuit of FIG. 26.

FIG. 27 is a circuit diagram exemplary of a possible implementation 180' of the adder circuit 180 exemplified in FIG. 26. In particular, FIG. 27 exemplifies an analog adder with class A output stage. The output nodes 165$_1$ and 165$_2$ of circuits 160$_1$ and 160$_2$ are connected together to implement the current adder node 184 (connection of node 165$_2$ to node 165$_1$ is not illustrated in FIG. 27 for the sake of ease of illustration). The output nodes 169$_1$ and 169$_2$ of circuits 160$_1$ and 160$_2$ are connected together to implement the current adder node 182. Circuit 180' further includes a first current mirror circuit arranged between nodes 184 and 191 and ground node GND. The first current mirror circuit is configured to sink from node 191 a current equal to the sum of currents I3+I4 output from adder node 184. In particular, the first current mirror includes an n-channel MOS transistor Q5 and an n-channel MOS transistor Q6. Transistor Q5 is diode-connected and has a drain terminal coupled to node 184 and a source terminal coupled to ground node GND. Transistor Q6 has a drain terminal coupled to node 191 and a source terminal coupled to ground node GND. The gate terminals of transistors Q5 and Q6 are connected one to the other (connection of such gate terminals is not illustrated in FIG. 27 for the sake of ease of illustration). Circuit 180' further includes a second current mirror circuit arranged between nodes 182 and 192 and ground node GND. The second current mirror circuit is configured to sink from node 192 a current equal to the sum of currents I1+I2 output from adder node 182. In particular, the second current mirror includes an n-channel MOS transistor Q7 and an n-channel MOS transistor Q8. Transistor Q7 is diode-connected and has a drain terminal coupled to node 182 and a source terminal coupled to ground node GND. Transistor Q8 has a drain terminal coupled to node 192 and a source terminal coupled to ground node GND. The gate terminals of transistors Q7 and Q8 are connected one to the other (connection of such gate terminals is not illustrated in FIG. 27 for the sake of ease of illustration). Node 191 is coupled to node 193 via an n-channel MOS transistor Q9 having a source terminal coupled to node 191 and a drain terminal coupled to node 193, so that a current I3+I4 is sunk from node 193. Node 192 is coupled to node 186 via an n-channel MOS transistor Q10 having a source terminal coupled to node 192 and a drain terminal coupled to node 186, so that a current I1+I2 is sunk from node 186. The gate terminals of transistors Q9 and Q10 are connected one to the other. A further current mirror circuit is arranged between nodes 193 and 186 and the supply rail 161. The further current mirror circuit is configured to inject (e.g., source) into node 186 a current equal to the sum of currents I3+I4 sunk by transistor Q9. In particular, the further current mirror may include a simple current mirror or a cascode current mirror implemented with p-channel MOS transistors, as exemplified in FIG. 27. Node 186 thus produces an error signal indicative of the quantity I3+I4−I1−I2, which is propagated to the control (e.g., gate) terminal of a transistor Q11 arranged in the output gain stage of circuit 180'. Particularly, the output stage includes a p-channel MOS transistor Q11 having a source terminal coupled to the supply rail 161, a drain terminal coupled to the output node 187 and a gate terminal coupled to node 186. The voltage ladder including resistors R188 and R189 and node 168" is arranged as discussed with reference to FIG. 26.

Figure 28:
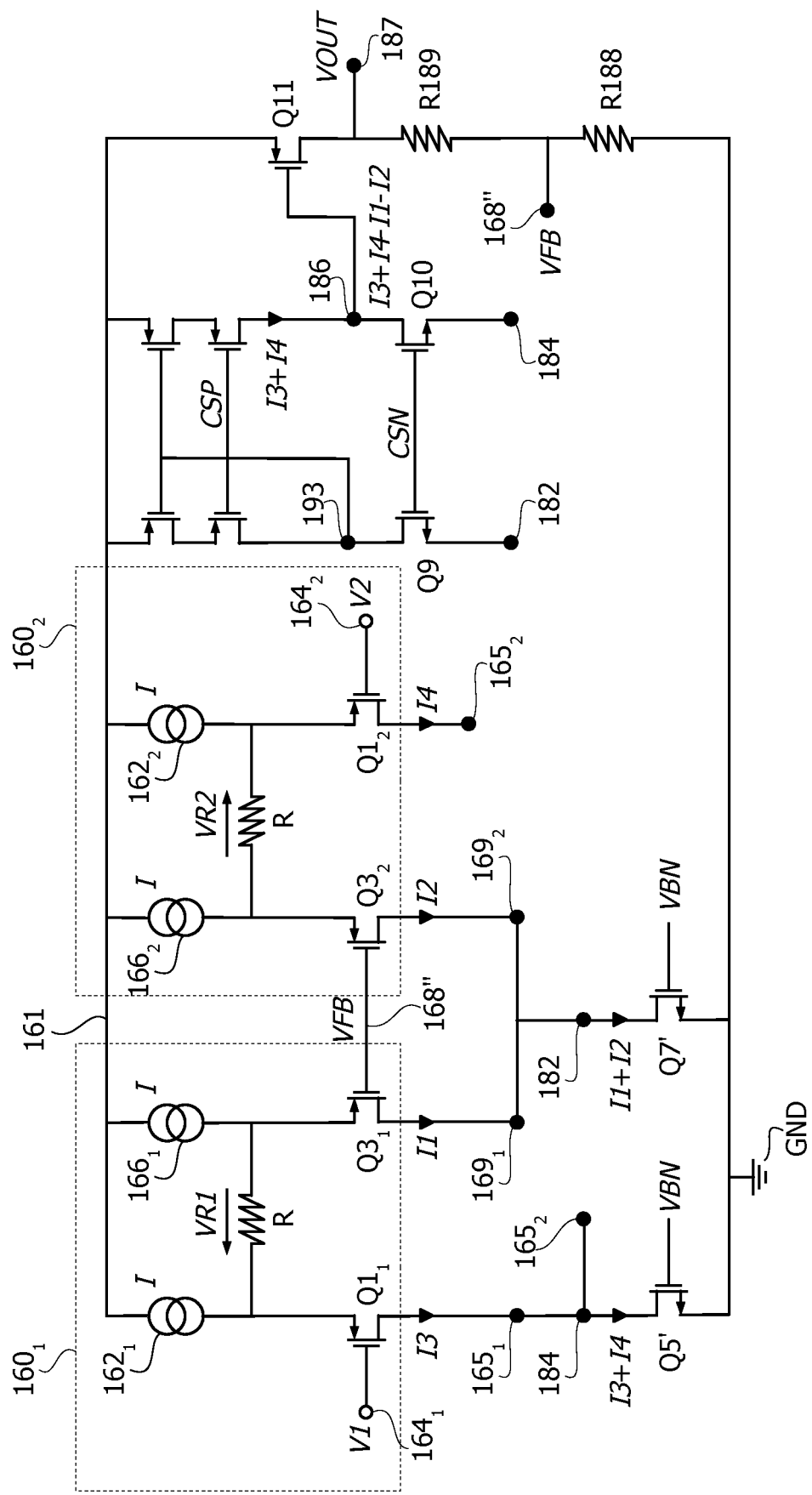
FIG. 28 is a circuit block diagram exemplary of another possible implementation of the adder circuit of FIG. 26.

FIG. 28 is a circuit diagram exemplary of a variant embodiment 180" of the adder circuit 180 exemplified in FIG. 26. In particular, FIG. 28 exemplifies an analog adder with folded cascode structure and class A output stage. The output nodes $165_1$ and $165_2$ of circuits $160_1$ and $160_2$ are connected together to implement the current adder node 184 (connection of node $165_2$ to node $165_1$ is not illustrated in FIG. 28 for the sake of ease of illustration). The output nodes $169_1$ and $169_2$ of circuits $160_1$ and $160_2$ are connected together to implement the current adder node 182. Circuit 180" further includes a first current generator arranged between node 184 and ground node GND. The first current generator may include an n-channel MOS transistor Q5' having a drain terminal coupled to node 184, a source terminal coupled to ground node GND and a gate terminal configured to receive a (fixed) biasing voltage VBN. Circuit 180" further includes a second current generator arranged between node 182 and ground node GND. The second current generator may include an n-channel MOS transistor Q7' having a drain terminal coupled to node 182, a source terminal coupled to ground node GND and a gate terminal configured to receive the biasing voltage VBN. Node 182 is directly connected to the source terminal of transistor Q9 and node 184 is directly connected to the source terminal of transistor Q10. It is noted that the current equation at node 184 is I3+I4+IQ10=IQ5 (that is, IQ10=IQ5−(I3+I4)) and the current equation at node 182 is I1+I2+IQ9=IQ7 (that is, IQ9=IQ7−(I1+I2)), where IQx indicates the current flowing through transistor x. The current equation at node 186 is IQ9=IQ10, thus IQ7−(I1+I2)=IQ5−(I3+I4). Due to the same biasing of Q5' and Q7', IQ7=IQ5 and thus I3+I4−I1−I2=0. Adder circuit 180" advantageously improves the input dynamic range of signals V1 and V2, which can be as low as zero.

The circuits exemplified in FIGS. 27 and 28 have approximately the same size of a classical operational transconductance amplifier (OTA) and can be modified to sum more than two signals, just by increasing the number of input stages 160 (i.e., the stages exemplified in FIG. 16) and adjusting the gain.

Therefore, one or more embodiments of the present disclosure provide circuits and methods for measuring the load current (e.g., AMOLED panel current) by sensing the current in the high-side switch S1 of the inverting buck-boost converter 144 (coupled to the negative rail 100*b*), using a sample-and-hold circuit and a low-pass weighted filter. One or more embodiments result in improved accuracy at light load current, reduced silicon area and current consumption, reduced quiescent current consumption and/or improved efficiency at light load. Additionally, one or more embodiments can be easily integrated with a trimming for offset cancellation and for sensitivity.

One or more embodiments may thus provide one or more of the following advantages:

- low silicon area occupation, low quiescent current and high efficiency at light load, insofar as the load current measurement is based on a high-side replica circuit (switch S3) already present in the buck-boost converters 144*a* and 144*b* for loop control and overcurrent protection (OCP);
- improved accuracy, suitability to sense low output current values, and no need for extra circuitry, insofar as the load current is sensed at the inverting buck-boost converter 144 instead of being sensed at the converter 140; and
- high accuracy/precision and possibility of being easily tuned, insofar as offset and/or sensitivity trimming can be added and tested at Automatic Test Equipment (ATE).

It is noted that one or more embodiments have been disclosed herein with particular reference to an inverting buck-boost converter, but various embodiments can be applied to any other topology of switching power converters, particularly in AMOLED products where ultra-low power consumption and high efficiency are desirable features.

More generally, one or more embodiments may provide a method to measure the relevant currents in a DC-DC converter (i.e., the currents flowing in the switches and in the inductor) by sensing the current of a single switch (e.g., the high-side switch).

Without prejudice to the underlying principles, the details and embodiments may vary, even significantly, with respect to what has been described by way of example, without departing from the extent of protection.

TABLE I

| boost converter | | |
|---|---|---|
| | Low-side sensing | High-side sensing |
| Switch 91 (signal $D_{91}$) | T1 | T2 |
| Switch 93 (signal $D_{93}$) | T2 | T2 |
| Switch 94 (signal $D_{94}$) | TSW − T2 | TSW − T2 |

TABLE II

| buck-boost converter | | |
|---|---|---|
| | High-side sensing | Low-side sensing |
| Switch 91 (signal $D_{91}$) | T1 | T2 |
| Switch 93 (signal $D_{93}$) | T2 | T2 |
| Switch 94 (signal $D_{94}$) | TSW − T2 | TSW − T2 |

TABLE III

| buck converter | | |
|---|---|---|
| | High-side sensing | Low-side sensing |
| Switch 91 (signal $D_{91}$) | T1 | T2 |
| Switch 93 (signal $D_{93}$) | TSW | TSW |
| Switch 94 (signal $D_{94}$) | 0 | 0 |

The invention claimed is:

1. An electronic device comprising a multiphase DC-DC switching converter circuit, the multiphase DC-DC switching converter circuit including:
a first DC-DC converter arrangement, including:
a first switching stage having a first switching node and a first converter output node, the first switching stage including a first high-side switch and a first low-side switch;
a first current sensing circuit configured to produce a first detection signal indicative of an instantaneous current flowing through one of said first high-side switch and said first low-side switch; and
a first time-averaging circuit configured to receive said first detection signal and produce, as a function thereof, a first time-averaged signal indicative of an average current flowing through said one of said first high-side switch and said first low-side switch during a respective switch conduction interval;
wherein said first current sensing circuit and said first time-averaging circuit are configured to produce said first time-averaged signal indicative, during said respective switch conduction interval, of the instantaneous current flowing through said one of said first high-side switch and said first low-side switch, and outside of said respective switch conduction interval, of the average current flowing through said one of said first high-side switch and said first low-side switch;
a second DC-DC converter arrangement, including:
a second switching stage having a second switching node and a second converter output node, the second switching stage including a second high-side switch and a second low-side switch;
a second current sensing circuit configured to produce a second detection signal indicative of an instantaneous current flowing through one of said second high-side switch and said second low-side switch; and
a second time-averaging circuit configured to receive said second detection signal and produce, as a function thereof, a second time-averaged signal indicative of an average current flowing through said one of said second high-side switch and said second low-side switch during a respective switch conduction interval;
wherein said second current sensing circuit and said second time-averaging circuit are configured to produce said second time-averaged signal indicative, during said respective switch conduction interval, of the instantaneous current flowing through said one of said second high-side switch and said second low-side switch, and outside of said respective switch conduction interval, of the average current flowing through said one of said second high-side switch and said second low-side switch; and signal summation and re-scaling circuitry comprising:
a current adder circuit configured to produce a voltage signal indicative of a sum of said first and second time-averaged signals; and
a re-scaler circuit configured to re-scale said voltage signal by a factor equal to (Ta+Tb)/(TSWa+TSWb), wherein Ta is a time period during which said first switching node is electrically coupled to said first converter output node, Tb is a time period during which said second switching node is electrically coupled to said second converter output node, TSWa is a switching period of said first DC-DC converter arrangement, and TSWb is a switching period of said second DC-DC converter arrangement to thereby produce an output signal indicative of an average output current of said multiphase DC-DC switching converter circuit.

2. The electronic device according to claim 1, wherein:
said first high-side switch is arranged between an input node of said first DC-DC converter arrangement and said first switching node, and said first low-side switch is arranged between said first switching node and said first converter output node; and
said second high-side switch is arranged between an input node of said second DC-DC converter arrangement and said second switching node, and said second low-side switch is arranged between said second switching node and said second converter output node.

3. The electronic device according to claim 2, wherein each of said first and second current sensing circuits includes:
a respective replica high-side switch and a respective first resistor, the respective replica high-side switch having a first terminal coupled to the respective switching node and a second terminal coupled to a first terminal of said respective first resistor, the respective first resistor having a second terminal coupled to a respective one of the first and second input nodes, wherein a respective voltage signal indicative of a voltage across said respective high-side switch is produced at a node intermediate said respective replica high-side switch and said respective first resistor;
a respective second resistor, a respective transistor and a respective third resistor coupled in series between a respective one of the first and second input nodes and a ground node, the respective second resistor having a first terminal coupled to said respective input node and a second terminal coupled to a source terminal of said respective transistor, said respective transistor having a drain terminal coupled to a first terminal of said respective third resistor, and said respective third resistor having a second terminal coupled to said ground node; and
a respective buffer circuit configured to propagate said respective voltage signal indicative of the voltage across said respective high-side switch to a control terminal of said respective transistor.

4. The electronic device according to claim 1, wherein:
said first current sensing circuit is configured to produce said first detection signal indicative of the instantaneous current flowing through said first high-side switch;
said second current sensing circuit is configured to produce said second detection signal indicative of the instantaneous current flowing through said second high-side switch;
said first time-averaging circuit is configured to produce said first time-averaged signal indicative of the average current flowing through said first high-side switch during a respective high-side switch conduction interval; and said second time-averaging circuit is configured to produce said second time-averaged signal indicative of the average current flowing through said second high-side switch during a respective high-side switch conduction interval.

5. The electronic device according to claim 1, wherein each of said first and second time-averaging circuits comprises a respective switch and a respective resistor arranged in series between an input node and an output node of the respective time-averaging circuit, and a respective capacitor arranged between the output node of the respective time-averaging circuit and a ground node, wherein the switch is driven to a conductive state during said respective switch conduction interval for that time-averaging circuit.

6. The electronic device according to claim 1, wherein said signal summation and re-scaling circuitry includes:
a first re-scaler circuit configured to receive said first time-averaged signal and re-scale said first time-averaged signal by a factor equal to Ta/TSWa to produce a respective first output signal indicative of the average output current of said first DC-DC converter arrangement;
a second re-scaler circuit configured to receive said second time-averaged signal and re-scale said second time-averaged signal by a factor equal to Tb/TSWb to produce a respective second output signal indicative of the average output current of said second DC-DC converter arrangement; and
an adder circuit configured to sum the output signal produced by said first re-scaler circuit and the output signal produced by said second re-scaler circuit to produce said output signal indicative of the average output current of said multiphase DC-DC switching converter circuit,
wherein said signal summation and re-scaling circuitry preferably includes a first buffer circuit arranged between said first re-scaler circuit and said adder circuit, and a second buffer circuit arranged between said second re-scaler circuit and said adder circuit.

7. The electronic device according to claim 6, wherein said first and second re-scaler circuits each include a respective first switch and a respective resistor arranged in series between an input node and an output node of the respective re-scaler circuit, a respective second switch arranged between a respective node intermediate the respective first switch and the respective resistor, and a respective capacitor arranged between the respective output node of the re-scaler circuit and a ground node, wherein the respective first switch is driven to a conductive state during a time period during which the respective switching node is electrically coupled to the respective converter output node, and the respective second switch is driven to a conductive state during complementary time periods with respect to said respective first switch.

8. The electronic device according to claim 1, wherein said re-scaler circuit includes a first switch and a resistor arranged in series between an input node and an output node of the re-scaler circuit, a second switch arranged between a node intermediate the first switch and the resistor, and a capacitor arranged between the output node of the re-scaler circuit and a ground node, wherein the first switch is driven to a conductive state during a time period during which first or second switching node is electrically coupled to the respective converter output node, and the second switch is driven to a conductive state during complementary time periods with respect to said first switch.

9. The electronic device according to claim 1, further comprising a power management integrated circuit including a first DC-DC converter circuit configured to produce a positive supply voltage for a display panel, and a second DC-DC converter circuit comprising the multiphase DC-DC switching converter circuit, configured to produce a negative supply voltage for said display panel.

10. The electronic device according to claim 9, further comprising:
a display panel including light-emitting diodes arranged in a matrix, wherein a positive supply terminal of said display panel is coupled to said first DC-DC converter circuit to receive said positive supply voltage and a negative supply terminal of said display panel is coupled to said second DC-DC converter circuit to receive said negative supply voltage.

11. An electronic device comprising a multiphase DC-DC switching converter circuit, the multiphase DC-DC switching converter circuit including:
a first DC-DC converter arrangement, including:
a first switching stage having a first switching node and a first converter output node, the first switching stage including a first high-side switch and a first low-side switch;
a first current sensing circuit configured to produce a first detection signal indicative of an instantaneous current flowing through one of said first high-side switch and said first low-side switch; and
a first time-averaging circuit configured to receive said first detection signal and produce, as a function thereof, a first time-averaged signal indicative of an average current flowing through said one of said first high-side switch and said first low-side switch during a respective switch conduction interval;
a second DC-DC converter arrangement, including:
a second switching stage having a second switching node and a second converter output node, the second switching stage including a second high-side switch and a second low-side switch;
a second current sensing circuit configured to produce a second detection signal indicative of an instantaneous current flowing through one of said second high-side switch and said second low-side switch; and
a second time-averaging circuit configured to receive said second detection signal and produce, as a function thereof, a second time-averaged signal indicative of an average current flowing through said one of said second high-side switch and said second low-side switch during a respective switch conduction interval; and
signal summation and re-scaling circuitry comprising:
a voltage adder circuit configured to produce, at a respective output node, a voltage signal indicative of a sum of said first time-averaged signal and said second time-averaged signal;
a re-scaler circuit configured to re-scale said voltage signal by a factor equal to (Ta+Tb)/(TSWa+TSWb), wherein Ta is a time period during which said first switching node is electrically coupled to said first converter output node, Tb is a time period during which said second switching node is electrically coupled to said second converter output node, TSWa is a switching period of said first DC-DC converter arrangement, and TSWb is a switching period of said second DC-DC converter arrangement to thereby produce an output signal indicative of an average output current of said multiphase DC-DC switching converter circuit.

12. The electronic device according to claim 11, wherein said voltage adder circuit includes:
a first differential circuit having a first terminal configured to receive said first time-averaged signal produced by said first time-averaging circuit; and
a second differential circuit having a first terminal configured to receive said second time-averaged signal produced by said second time-averaging circuit;
wherein a second terminal of said first differential circuit and a second terminal of said second differential circuit are coupled together to produce an average signal that is an average of said first and second time-averaged signals;
wherein said average signal is passed to an intermediate node of a voltage divider to produce, at a positive node of said voltage divider, said voltage signal indicative of the sum of said first and second time-averaged signals;
wherein said first differential circuit is configured to produce a first output current indicative of a difference between said first time-averaged signal and said average signal and a second output current indicative of a complement of the difference between said first time-averaged signal and said average signal;
wherein said second differential circuit is configured to produce a third output current indicative of a difference between said second time-averaged signal and said average signal and a fourth output current indicative of a complement of the difference between said second time-averaged signal and said average signal; and
wherein said voltage adder circuit further includes:
a first current adder node configured to sum said first output current and said third output current;
a second current adder node configured to sum said second output current and said fourth output current;
a third adder node configured to subtract a current output by said second current adder node from a current output by said first current adder node to produce an error signal; and
a buffer circuit configured to propagate said error signal to said positive node of said voltage divider.

13. The electronic device according to claim 11, wherein said re-scaler circuit includes a first switch and a resistor arranged in series between an input node and an output node of the re-scaler circuit, a second switch arranged between a node intermediate the first switch and the resistor, and a capacitor arranged between the output node of the re-scaler circuit and a ground node, wherein the first switch is driven to a conductive state during a time period during which first or second switching node is electrically coupled to the respective converter output node, and the second switch is driven to a conductive state during complementary time periods with respect to said first switch.

14. The electronic device according to claim 11, further comprising a power management integrated circuit including a first DC-DC converter circuit configured to produce a positive supply voltage for a display panel, and
a second DC-DC converter circuit comprising the multiphase DC-DC switching converter circuit, configured to produce a negative supply voltage for said display panel.

15. The electronic device according to claim 14, further comprising:

a display panel including light-emitting diodes arranged in a matrix, wherein a positive supply terminal of said display panel is coupled to said first DC-DC converter circuit to receive said positive supply voltage and a negative supply terminal of said display panel is coupled to said second DC-DC converter circuit to receive said negative supply voltage.

16. The electronic device according to claim 11, wherein:
said first high-side switch is arranged between an input node of said first DC-DC converter arrangement and said first switching node, and said first low-side switch is arranged between said first switching node and said first converter output node; and
said second high-side switch is arranged between an input node of said second DC-DC converter arrangement and said second switching node, and said second low-side switch is arranged between said second switching node and said second converter output node.

17. The electronic device according to claim 16, wherein each of said first and second current sensing circuits includes:
a respective replica high-side switch and a respective first resistor, the respective replica high-side switch having a first terminal coupled to the respective switching node and a second terminal coupled to a first terminal of said respective first resistor, the respective first resistor having a second terminal coupled to a respective one of the first and second input nodes, wherein a respective voltage signal indicative of a voltage across said respective high-side switch is produced at a node intermediate said respective replica high-side switch and said respective first resistor;
a respective second resistor, a respective transistor and a respective third resistor coupled in series between a respective one of the first and second input nodes and a ground node, the respective second resistor having a first terminal coupled to said respective input node and a second terminal coupled to a source terminal of said respective transistor, said respective transistor having a drain terminal coupled to a first terminal of said respective third resistor, and said respective third resistor having a second terminal coupled to said ground node; and
a respective buffer circuit configured to propagate said respective voltage signal indicative of the voltage across said respective high-side switch to a control terminal of said respective transistor.

18. The electronic device according to claim 11, wherein:
said first current sensing circuit is configured to produce said first detection signal indicative of the instantaneous current flowing through said first high-side switch;
said second current sensing circuit is configured to produce said second detection signal indicative of the instantaneous current flowing through said second high-side switch;
said first time-averaging circuit is configured to produce said first time-averaged signal indicative of the average current flowing through said first high-side switch during a respective high-side switch conduction interval; and
said second time-averaging circuit is configured to produce said second time-averaged signal indicative of the average current flowing through said second high-side switch during a respective high-side switch conduction interval.

19. The electronic device according to claim 11, wherein each of said first and second time-averaging circuits comprises a respective switch and a respective resistor arranged in series between an input node and an output node of the respective time-averaging circuit, and a respective capacitor arranged between the output node of the respective time-averaging circuit and a ground node, wherein the switch is driven to a conductive state during said respective switch conduction interval for that time-averaging circuit.

20. An electronic device, comprising:
    a multiphase DC-DC switching converter circuit with two converter arrangements, wherein each converter arrangement includes:
        a switching stage with high-side and low-side switches;
        a current sensing circuit for detecting instantaneous current through the high-side switch or the low-side switch; and
        a time-averaging circuit for producing averaged signals based on sensed current;
    a current adder configured to sum the averaged signals; and
    a re-scaler circuit configured to rescale the sum to thereby produce an output signal representing an average output current of the multiphase DC-DC switching converter circuit.

21. The electronic device of claim 20, wherein the first and second high-side switches connect input nodes to respective switching nodes, and the first and second low-side switches connect corresponding respective switching nodes to converter output nodes.

22. The electronic device of claim 21, wherein each current sensing circuit includes:
    a first resistor coupled to a corresponding one of the input nodes;
    a replica high-side switch coupled between a corresponding one of the switching nodes and the first resistor;
    a second resistor coupled to the corresponding one of the input nodes;
    a third resistor coupled to ground; and
    a transistor coupled between the second resistor and the third resistor;
    wherein the replica high-side switch and resistors generate a voltage signal reflecting the voltage across the corresponding high-side switch, while a buffer circuit propagates the voltage signal to control the transistor.

23. The electronic device of claim 20, wherein the first and second current sensing circuits detect instantaneous currents through the first and second high-side switches, while the first and second time-averaging circuits produce signals indicative of average currents flowing through the respective high-side switches during conduction intervals.

24. The electronic device of claim 20, wherein the re-scaler circuit comprises first and second re-scaler circuits for re-scaling the averaged signals, an adder circuit to sum the re-scaled signals, and buffer circuits between the first and second re-scaler circuits and the adder circuit to produce an output signal representing the average output current of the multiphase DC-DC switching converter circuit.

* * * * *